United States Patent [19]
Otani et al.

[11] Patent Number: 5,966,333
[45] Date of Patent: Oct. 12, 1999

[54] SEMICONDUCTOR MEMORY DEVICE

[75] Inventors: Takayuki Otani, Hachioji; Yasumitsu Nozawa, Yokohama; Satoru Hoshi, Kawasaki, all of Japan

[73] Assignee: Kabushiki Kaisha Toshiba, Tokyo, Japan

[21] Appl. No.: 08/984,311

[22] Filed: Dec. 3, 1997

[30] Foreign Application Priority Data

Dec. 4, 1996 [JP] Japan .................................. 8-324360

[51] Int. Cl.⁶ .................................................. G11C 7/00
[52] U.S. Cl. ................ 365/200; 365/225.7; 365/230.03; 365/233; 365/233.5
[58] Field of Search .............................. 365/200, 225.7, 365/233.5, 233, 230.03

[56] References Cited

U.S. PATENT DOCUMENTS 5,479,371  12/1995  Ootani ..................................... 365/200
5,670,976   9/1997  Chiu et al. .......................... 365/200 X

FOREIGN PATENT DOCUMENTS 6195996  7/1994  Japan.

Primary Examiner—Do Hyun Yoo
Attorney, Agent, or Firm—Loeb & Loeb LLP

[57] ABSTRACT

A semiconductor memory device includes normal row selection lines (NWL1 to NWL128) for selecting one of normal rows, a spare row selection line (SWL) for selecting a spare row instead when one of the normal rows has a defect, fuses (F1 to F128) which are respectively arranged on the normal row selection lines, and blown when a defect exists, a normal row non-selection circuit (inverters IN3 and IN6 and gate G3) when one of the fuses (F1 to F128) is blown, setting a corresponding normal row in a non-selected state, and a spare row selection circuit (gates G4, G5, and G6, transistors P2 and N1, a NOR gate NR1, and an inverter IN6) selecting the spare row instead of the defective normal row. The spare row selection circuit performs dynamic operation in synchronism with a clock (ck). In this manner, control of, when a defect exists in a normal row or column, switching the defective row or column to a spare row or column is performed by dynamic operation in synchronism with an internal clock, thereby increasing the access speed.

12 Claims, 18 Drawing Sheets

SEMICONDUCTOR MEMORY DEVICE

BACKGROUND OF THE INVENTION

The present invention relates to a semiconductor memory device and, more particularly, to a semiconductor memory device having a redundancy circuit.

In a recent semiconductor memory device, a redundancy circuit is arranged to compensate a decrease in yield caused by generation of many defects along with an increase in capacity. The redundancy circuit has a spare memory cell array mounted on a chip in advance. When a defect is found in a bit, row, or column in an inspection step upon manufacturing, the defective portion is replaced with a spare cell to enable all bits to operate correctly, and remove the defect. An example of this redundancy circuit is described in S. Konishi et al., "A 64 Kb CMOS SRAMs", IEEE International Solid-State Circuit Conference Digest of Technical Paper, 1982, pp. 258–259.

In a device having the redundancy arrangement, a selection control mechanism of accessing a spare cell instead of a defective cell upon reception of an address signal that selects the defective cell must be realized.

Some of conventional devices have a control mechanism in which fuse elements are formed with a wiring layer or interconnection, and a fuse element corresponding to a defective cell is blown by irradiating a laser beam thereon, thereby accessing a spare cell. For example, to replace one normal row having a defect with one spare row in a memory cell array having 128 normal rows, seven fuses must be respectively arranged for seven address bits ($2^7$=128). When the defective normal row is found, of the seven fuses, corresponding ones are blown, and a defect address is written. In activating the device, an externally input address is compared with the defect address written in the fuses. If these addresses coincide with each other, a spare cell is accessed instead of the defective cell.

When a device with the control mechanism using such a fuse has one spare row for 128 normal rows, seven fuse elements, seven pairs of address comparison circuits, and a spare row decoder circuit must be mounted, and a maximum of seven fusing steps must be performed.

As the capacity of the memory cell array increases, the element area for mounting the fuse element, the comparison circuit, and the spare row decoder circuit increases, and the fusing count in the fusing step also increase. A semiconductor memory device with a capacity of 1 Mbits or more has 1,024 normal rows. If one spare row is prepared for every 128 normal rows, this semiconductor memory device requires eight spare rows. To remedy one defective normal row requires 10 ($2^{10}$=1,024) fuse elements, 10 pairs of address comparison circuits, and a spare row address circuit. Accordingly, this semiconductor memory device requires 80 fuse elements, 80 pairs of address comparison circuits, and a spare row decoder circuit as a whole, and the maximum fusing count increases to 80.

In this conventional device, therefore, the element area and the fusing count undesirably increase with capacity of the semiconductor memory device.

Another example of the conventional semiconductor memory devices is disclosed in Japanese Patent Application No. 4-340354 (Japanese Patent Laid-Open No. 6-195996), in which a defective cell can be replaced with a spare cell without recording each address bit of the defective memory cell. In this device, one defective cell portion can be replaced with a spare cell by mounting one fuse and one fusing operation at most. FIG. 11 shows the circuit arrangement.

One spare row selection line (spare word line) SWL is arranged for 128 normal row selection lines (normal word lines) NWL1 to NWL128. Normal row decoder circuits (row main decoders) RMD1 to RMD128 for selecting the normal rows are arranged, and isolation fuses F1 to F128 are series-connected to the output sides of the normal row decoder circuits RMD1 to RMD128. When a defect is found, a fuse F of the defective row is blown to electrically isolate the output of the normal row decoder circuit RMD from the normal row selection line NWL. The gates of p-channel MOS transistors P1 to P128 for monitoring the voltages of the respective normal row selection lines NWL are connected to the input terminals of word line buffers WB1 to WB128 of the respective normal row selection lines NWL.

Normally, one of the normal row decoder circuits RMD is selected to change its output to low level and turn on the p-channel MOS transistors P1 to P128 having gates connected to this row. A node R1 connected to the drain of the p-channel MOS transistor P is charged to high level. By a NOR gate NOR101 and an inverter IN100 receiving this potential, the spare row selection line SWL is changed to high level and set in a non-selected state.

If a defect exists in one of the 128 normal row selection lines NWL, the corresponding fuse F is blown. The input terminals of the word line buffers WB are charged to high level by p-channel MOS transistors P101 to P228 having drains connected to these input terminals. When an address that selects the defective cell is input, the input terminals of all the word line buffers WB1 to WB128 are charged to high level, all the p-channel MOS transistors P1 to P128 are turned off, and the node R1 changes to low level without being charged. The potential of the node R1 is input to the NOR gate NOR101 and the inverter IN100 to change the spare row selection line SWL to low level, thereby setting it in a selected state.

FIG. 12 shows a circuit in which the switching mechanism to a redundancy circuit for rows is also applied to columns. One input/output interface I/O is arranged for every N (N is an integer of 2 or more) columns, eight input/output interfaces I/O form one block, and each block has one spare column (SC) 203. A switching mechanism to the spare column 203 when one defect exists in a normal column is the same as the above-described switching mechanism for rows, and is disclosed in Japanese Patent Application No. 4-340354 (Japanese Patent Laid-Open No. 6-195996).

The conventional device shown in FIG. 11 or 12 has the following problems. Exemplifying the circuit shown in FIG. 11, selection switching between the normal row selection lines NWL1 to NWL128 and the spare row selection line SWL is performed by the p-channel MOS transistors P101 to P228 which charge the input terminals of the word line buffers WB, the p-channel MOS transistors P1 to P128 which detect the potentials of these input terminals, and the NOR gate NOR101 and the inverter IN100 which logically operate the outputs from the p-channel MOS transistors P1 to P128. However, the selection switching mechanism does not synchronize with a clock signal that defines the access cycle of a memory cell, and operates statically. This arrangement is therefore difficult to apply to a semiconductor memory device required to operate at a high speed. More specifically, upon selecting a word line, that particularly requires high speed in the semiconductor memory device, after the logical operations of the normal row decoder circuits RMD1 to RMD128 are established to confirm the potentials of the output terminals, the p-channel MOS transistors P1 to P128 and P101 to P228, the NOR gate NOR101, and the inverter IN100 statically operate to execute selection. That is, the circuit at this portion operates without synchronizing with the clock signal that defines the timing of internal operation. Further, each transistor performs static operation of holding the potential by maintaining an ON or OFF state over the whole period, unlike dynamic operation in which the transistor is kept on for only a predetermined period, and charges the potential in the capacitance to hold the potential for an OFF period.

The time necessary for operating the circuit at this portion greatly influences the whole word line selection operation, causing an operation delay. This occurs not only in word line selection but also in column line selection shown in FIG. 12, generating an operation delay.

SUMMARY OF THE INVENTION

It is, therefore, an object of the present invention to provide a semiconductor memory device having a redundancy arrangement in which switching a normal row or column to a spare row or column can be performed at a high speed.

According to the present invention, there is provided a semiconductor memory device which has at least one block in which memory cells are respectively arranged on a plurality of normal rows and one spare row, and selects a row using a clock signal, comprising a plurality of normal row selection lines for selecting one of the normal rows in each block, one spare row selection line for selecting the spare row instead in each block when one of the normal rows has a defect, normal row non-selection circuits, arranged on each of the normal row selection lines, when one of the normal rows has a defect, setting a corresponding one normal row selection line in a non-selected state, and spare row selection circuit, when all the normal row selection lines are in a non-selected state, setting the spare row selection line in a selected state by dynamic operation in synchronism with the clock signal in a corresponding block.

According to the present invention, there is provided a semiconductor memory device comprising in each block a plurality of normal row selection lines for selecting one of the normal rows, normal row selection signal generation circuits which are respectively arranged in correspondence with the normal row selection lines, and output normal row selection signals upon externally receiving an address signal that selects one of the normal lines, fuses which are respectively arranged in correspondence with the normal row selection lines, and each of which has one terminal connected to an output terminal of a corresponding normal row selection signal generation circuit, and is blown when a corresponding normal row has a defect, normal row selection circuits which are respectively arranged in correspondence with the normal row selection lines, have input terminals connected to the other terminals of the corresponding fuses, and the other terminals connected to the corresponding normal row selection lines, when the corresponding fuses are not blown, receive the normal row selection signals output from the normal row selection signal generation circuits connected via the fuses to set the corresponding normal row selection lines in a selected state, and when the corresponding fuses are blown, set the corresponding normal row selection lines in a non-selected state, one spare row selection line for selecting the spare row instead when one of the normal rows has a defect, spare row selection signal generation circuits which respectively have input terminals connected to input terminals of the normal row selection circuits, output spare row non-selection signals when the corresponding fuses are not blown, and output spare row selection signals when the corresponding fuses are blown, and a spare row selection circuit which has an input terminal connected to output terminals of the spare row selection signal generation circuits, and an output terminal connected to the spare row selection line, and sets the spare row selection line in a selected state when the spare row selection signals are supplied from the spare row selection signal generation circuits, wherein the row selection signal generation circuits output the spare row selection signals by dynamic operation in synchronism with the clock signal.

When N (N is an integer of 2 or more) blocks are arranged, the normal row selection lines can be laid out to be mutually interleaved between the respective blocks, and the spare row selection lines can be laid out to be mutually interleaved between the respective blocks.

This arrangement of selecting a normal or spare row can also be applied to columns.

As described above, according to the semiconductor memory device of the present invention, when either of normal row and column has a defect, and is switched to a spare row or column, this switching control can be performed by dynamic operation in synchronism with a clock signal to increase the switching control speed.

DESCRIPTION OF THE PREFERRED EMBODIMENTS

An embodiment of the present invention will be described below with reference to the accompanying drawings.

Figure 1:
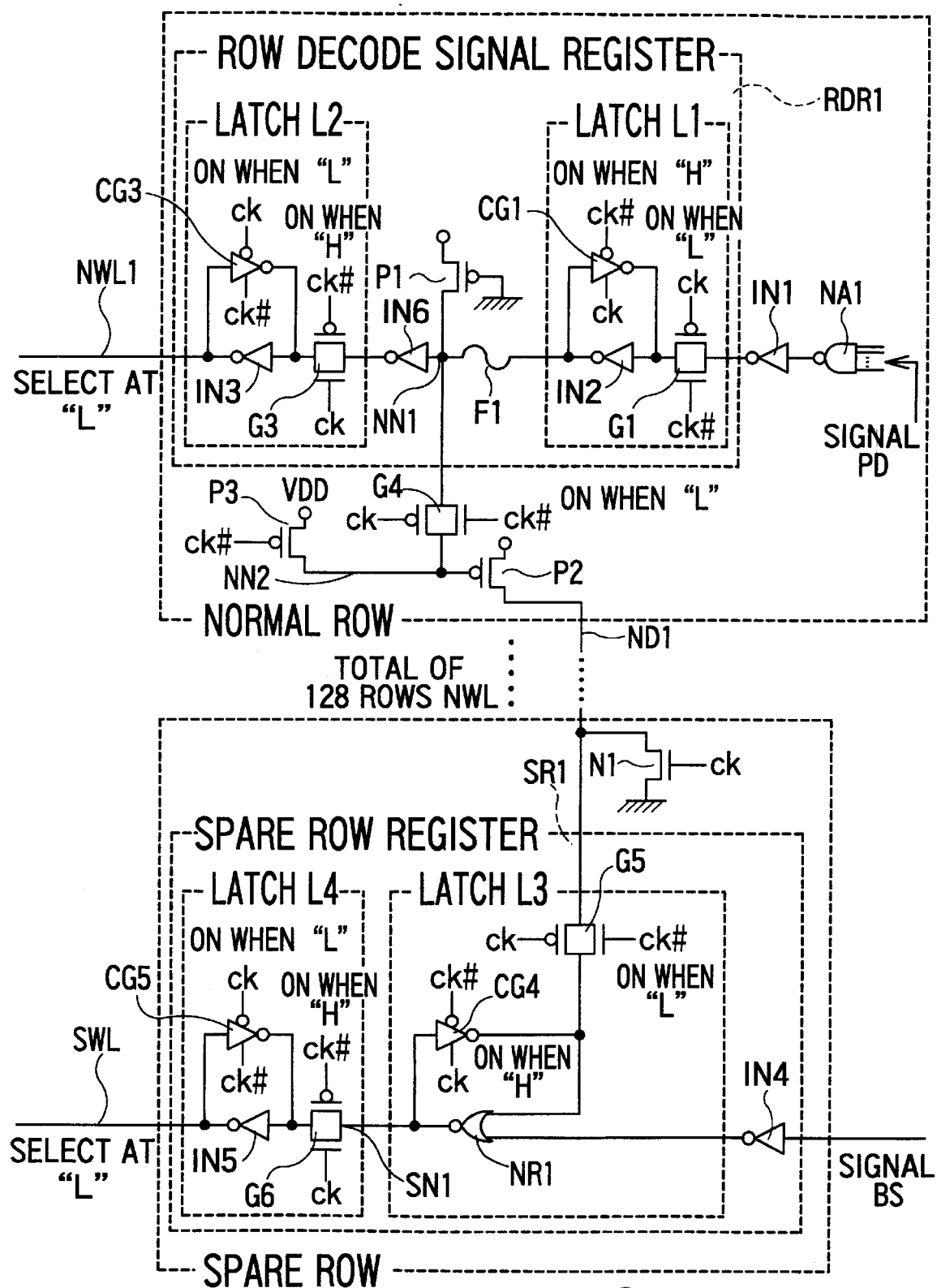
FIG. 1 is a circuit diagram showing the arrangement of a semiconductor memory device according to the first embodiment of the present invention.

FIG. 1 shows the arrangement of a semiconductor memory device according to the first embodiment of the present invention. One spare row is prepared for 128 normal rows, and each row is selected at low level. A fuse F1 is series-connected to each normal row selection line. When a defect exists, the fuse F1 is blown.

Figure 13:
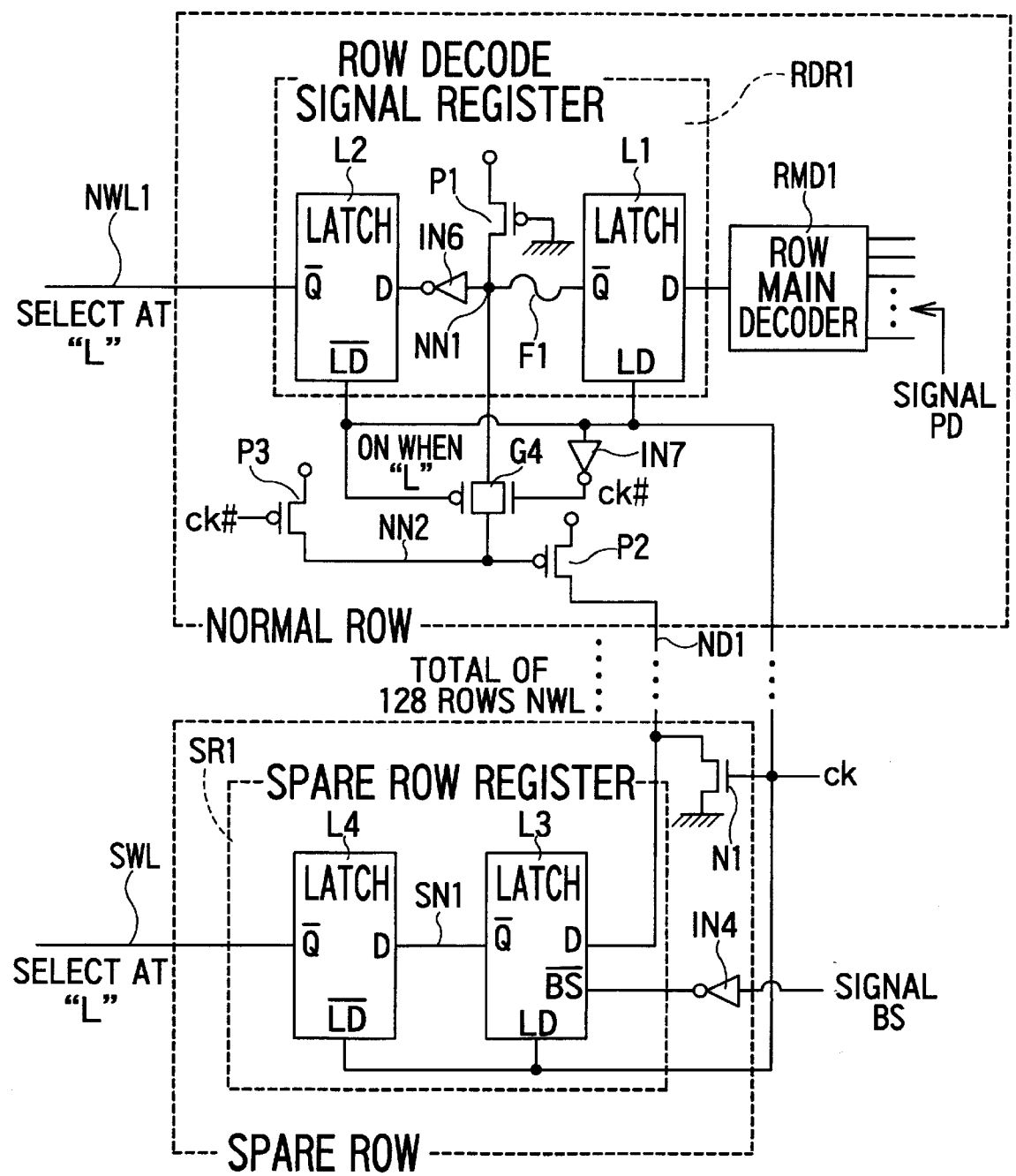
FIG. 13 is a circuit diagram showing a circuit arrangement when the circuit arrangement shown in FIG. 1 is expressed using a latch block.
Figure 14A:
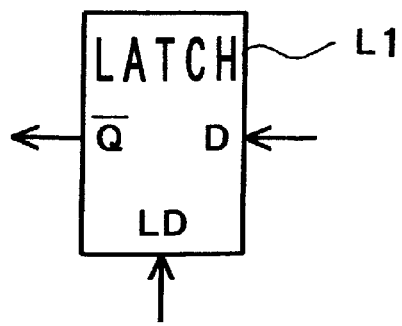
FIGS. 14A to 14D are circuit diagrams showing detailed arrangements of latch circuits shown in FIG. 13.
Figure 14B:
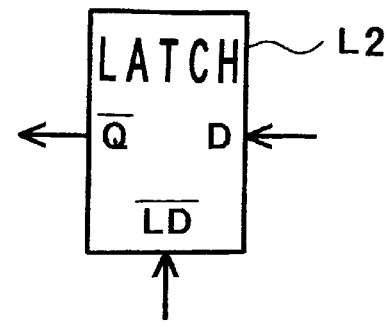
Figure 14C:
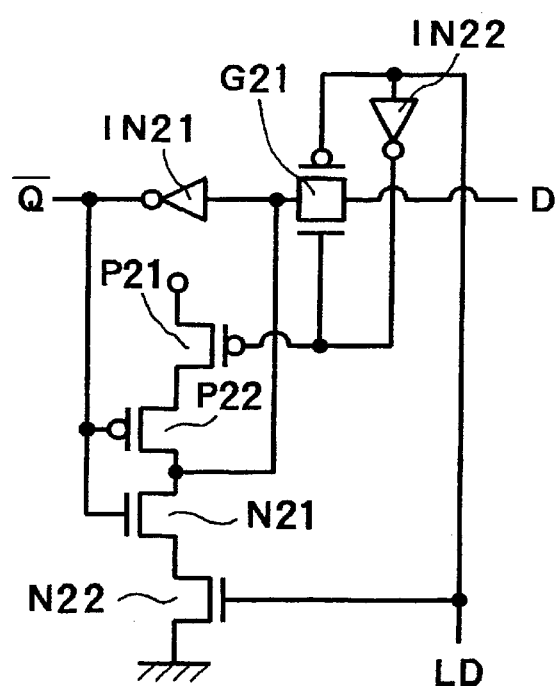
Figure 14D:
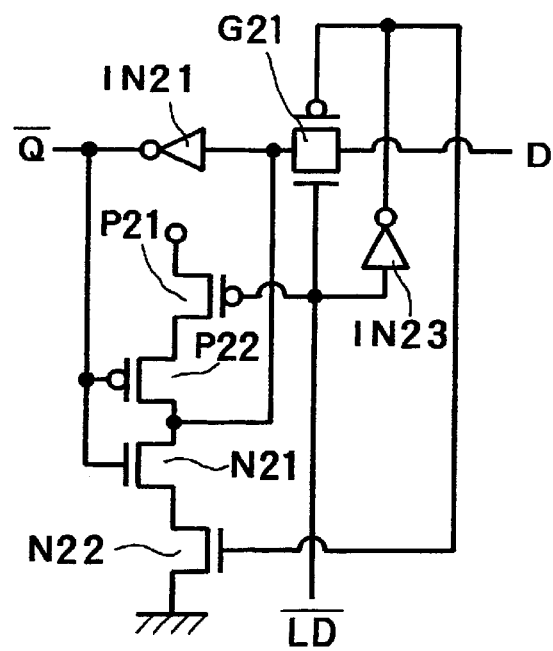
Figure 16:
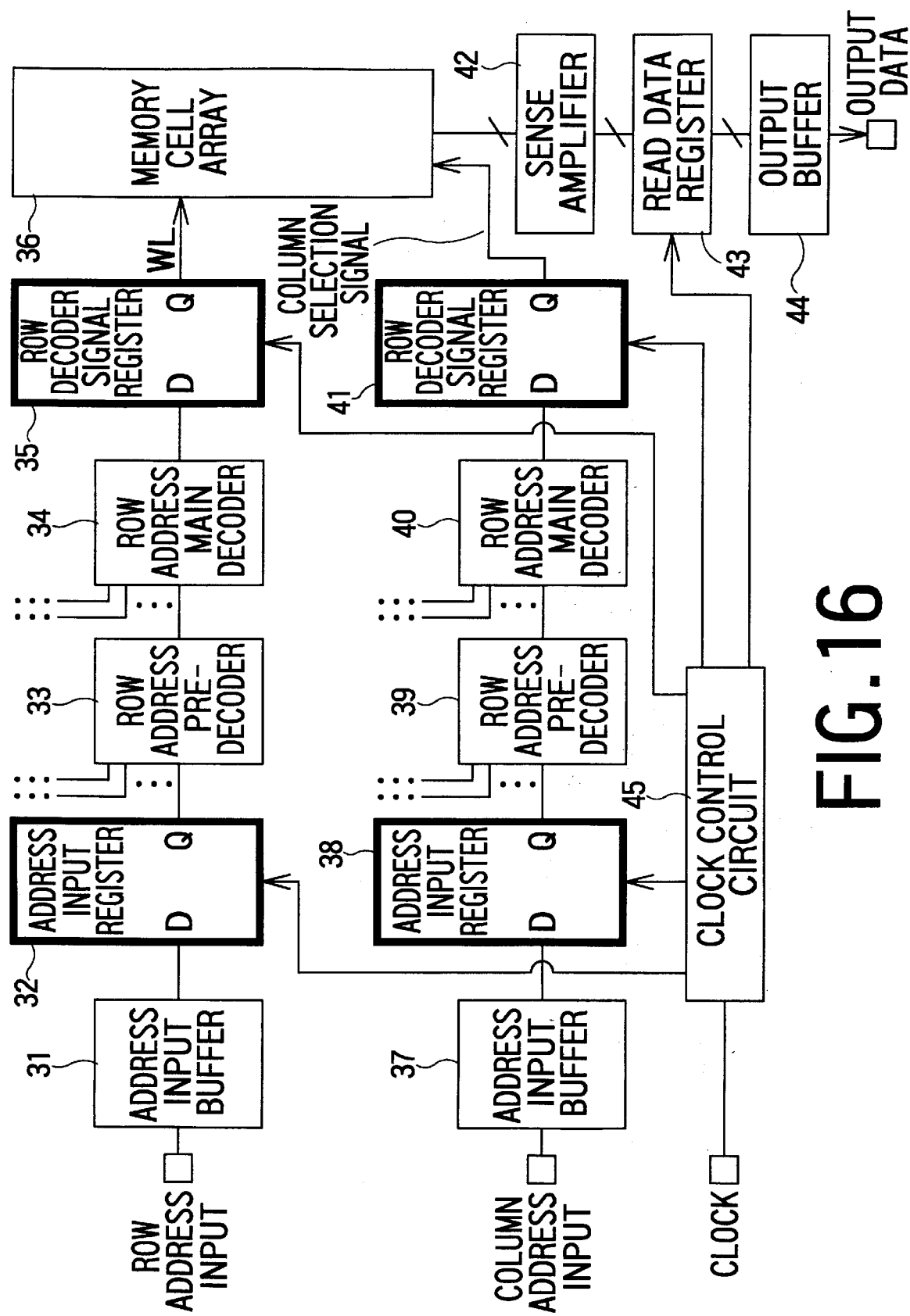
FIG. 16 is a block diagram showing a circuit arrangement when the circuit arrangement shown in FIG. 1 is applied to a memory system.

FIG. 13 shows the arrangement of the embodiment shown in FIG. 1 which is expressed using a latch block. FIGS. 14A to 14D show a detailed circuit example of latch circuits used in FIG. 13. FIG. 14A shows the block arrangement of a latch circuit L1, FIG. 14C shows a detailed arrangement of the circuit L1, FIG. 14B shows the block arrangement of a latch circuit L2, and FIG. 14D shows a detailed arrangement of the circuit L2. FIG. 16 shows the arrangement of synchronous (register) control within a memory chip in the embodiment of FIGS. 1 and 13.

As shown in FIG. 16, the embodiment shown in FIGS. 1 and 13 has an arrangement in which a register circuit with a function of receiving an input signal at the leading edge of a clock signal is arranged on the input stage of a word line drive circuit. FIG. 16 shows a case wherein registers are respectively arranged on the output stage of an address input buffer and the input stage of a data output buffer, and this embodiment is applied to the whole system including a memory cell array 36.

In a conventional clock synchronous memory, register circuits are arranged on only the output stage of an input buffer and the input stage of a data output buffer, an address input register receives an input address, and a read data register receives read data in one clock cycle. In recent years, however, the clock frequency has increased, and this operation often cannot be performed within one clock cycle time. For this reason, a row decode signal register must be further arranged on the input stage of the word line drive circuit to attain deeper pipelining, like this embodiment.

Figure 17:
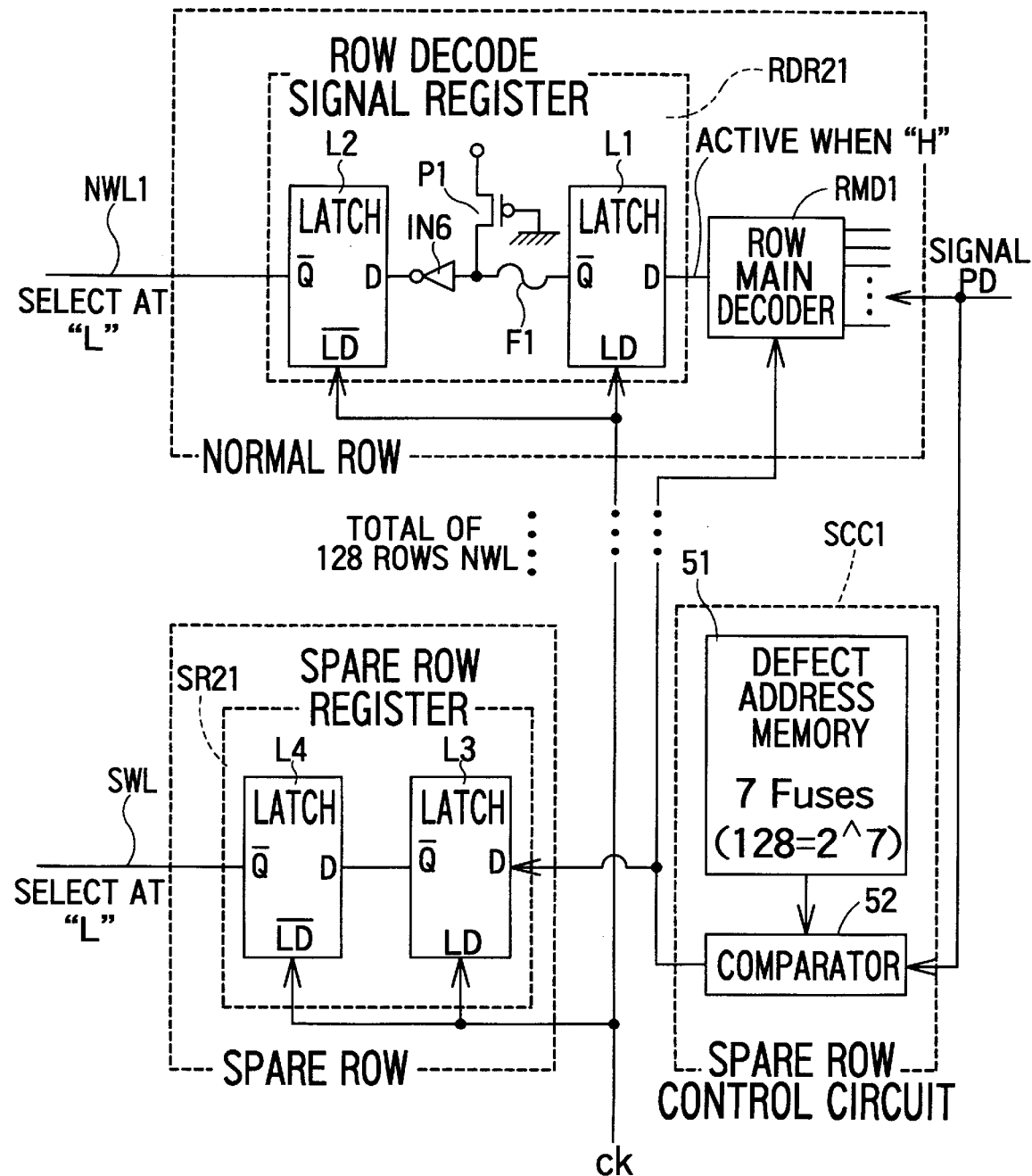
FIG. 17 is a circuit diagram showing the arrangement of a conventional semiconductor memory device.

FIG. 17 shows the arrangement of controlling a normal row/spare row selection line when a row (column) address decode signal register is arranged like the embodiment shown in FIG. 16, and a plurality of fuses (seven fuses for 128 rows) are arranged to store a defect address, like not this embodiment but the prior art. In controlling a normal row/spare row selection line, the defect address is stored in the seven fuses, and an address signal input in each clock cycle is compared with the defect address stored in the fuses to select a normal or spare row, like the prior art. As described above, in this conventional scheme, seven fuse elements must be arranged for one spare row, a controller such as an address comparator must be mounted on the chip, and a maximum of seven fusing steps must be performed on the basis of the defect address upon manufacturing.

Figure 2:
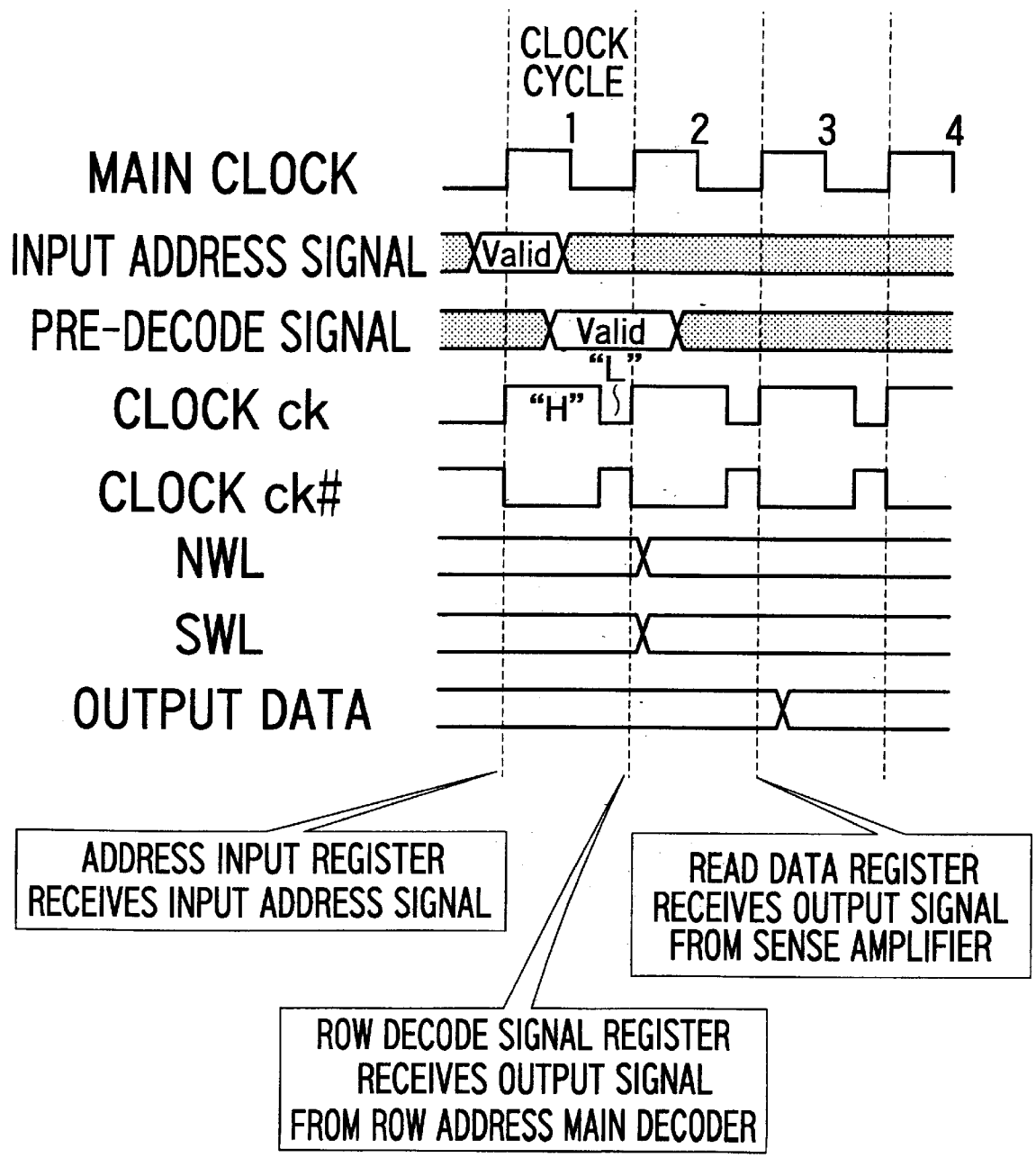
FIG. 2 is a timing chart showing the operation waveforms of the respective signals in the semiconductor memory device.

The operation waveforms of the respective signals in the embodiment shown in FIGS. 1, 13, and 16 are shown in a timing chart of FIG. 2. A clock ck and an inverted clock ck# used in FIG. 1 are generated by shaping the waveform of a main clock. In the circuit shown in FIG. 16, input address signals received by address input registers 32 and 38 at the leading edge of clock cycle 1 of the main clock pass through pre-decoders 33 and 39 and main decoders 34 and 40 in clock cycle 1, and pre-decoding and main decoding are complete before the leading edge of clock cycle 2. After output signals from the row and column main decoders 34 and 40 are input to row and column decode signal registers 35 and 41 at the leading edge of clock cycle 2, a word line and column selection signals are driven to perform selection control of the memory cell array 36. Memory cell data read from the memory cell array 36 is amplified by a sense amplifier 42 within clock cycle 2. An output signal from the sense amplifier 42 is input to a read data register 43 at the leading edge of clock cycle 3. The read data received by the read data register 43 is output from an output buffer 44 to a data output terminal within clock cycle 3.

The operation of the circuit shown in FIGS. 1 and 13 according to the embodiment of the present invention will be explained in more detail below. While the clock ck of clock cycle 1 is "high" in synchronism with the leading edge of clock cycle 1 of the main clock, the address input signal is input as a pre-decode signal PD to a normal row decoder circuit NA1 serving as a row address main decoder RMD. This signal passes through an inverter IN1 to be input to the first latch circuit L1 constituting a row decode signal register. At this time, the inverter IN1 outputs a "high"-level signal when a corresponding row is selected, or a "low"-level signal when the row is not selected.

The latch circuit L1 has a gate circuit G1 which is ON while the clock ck is "low", a clocked inverter CG1 and an inverter IN2 which are ON while the clock ck is "high". When the clock ck changes to "low" in clock cycle 1, the gate G1 of the latch circuit L1 is turned on. The main signal decoded passes through the inverter IN2 to be output from the latch circuit L1. When this normal row has no defect, the signal output from the latch circuit L1 is input to an inverter IN6 through the fuse F1 and inverted. Then, the inverted signal is transferred to the input terminal of the latch circuit L2 constituting a row decode signal register RDR1. A p-channel MOS transistor P1 having its gate grounded is connected between a power supply voltage VDD and a node NN1 serving as the output terminal of the fuse F1. That is, the transistor P1 is always ON. However, the transistor P1 is small, and the transistor of the inverter IN2 for discharging the output terminal is larger when the output from the inverter IN2 is at "low" level. For this reason, the node NN1 is driven to "low" level at a sufficiently high speed. While the clock ck of clock cycle 1 is "low", the node NN1 receives a potential as a result of row main decoding. If this row is a selected row, the potential is at "low" level; otherwise, the potential is at "high" level. Only when the row is found to be defective by a test upon manufacturing, a laser beam is irradiated on the fuse F1 of each row to electrically isolate the node NN1 from the latch circuit L1. That is, in the defective row, the potential of the node NN1 is always kept at "high" level regardless of the clock.

The latch circuit L2 has a gate circuit G3 which is ON while the clock ck is "high", a clocked inverter CG3 and an inverter IN3 which are ON only when the clock ck is "low". After the clock ck rises at the start of clock cycle 2, the clocked inverter CG1 is turned on, and the decode potential of the node NN1 is latched by the clocked inverter CG1 and the inverter IN2. At the same time, the gate circuit G3 of the latch circuit L2 is turned on. A decode signal transferred to the input terminal of the latch circuit L2 passes through the inverter IN3 to be output to normal row selection lines NWL1 to NWL128. The normal row selection line NWL is selected at "low" level, and is not selected at "high" level. Even if the clock ck changes to "low" level in the second half of clock cycle 2, the potential of the normal row selection line NWL1 is latched and held by the clocked inverter CG3 and the inverter IN3 because the clocked inverter CG3 is turned on.

The potential of the node NN1 is supplied to the input terminal of a clocked gate G4. An output node NN2 of the clocked gate G4 is connected to the gate of a p-channel MOS transistor P2 having a source connected to the power supply VDD and a drain connected to a node ND1. The node NN2 is further connected to the drain of a p-channel MOS transistor P3 having a source connected to the power supply VDD and a gate which receives the inverted signal ck# of the clock ck. The clocked gate G4 opens to transfer the potential of the node NN1 to the node NN2 when the clock ck is at "low" level. The node ND1 is connected to the drain terminal of the transistor P2 on each row within the block. The node ND1 is further connected to the drain of an n-channel MOS transistor N1 which is arranged one in each block. The n-channel MOS transistor N1 has a source which is connected to the ground terminal, and a gate which receives the clock ck. The node ND1 connected to all the rows within the block is further connected to one spare row arranged in the block.

The spare row has a register for selecting the word line of the spare row, and the register is constituted by cascade-connected latch circuits L3 and L4. The latch circuit L3 has a clocked gate G5 which is ON while the clock ck is "low", a clocked inverter CG4 and a NOR gate NR1 which are ON while the clock ck is "high". The potential of the node ND1 is input to the input node of the clocked gate G5. The potential of the node ND1 passes through the gate G5 which opens when the clock ck is at "low" level, and is input to one input terminal of the NOR gate NR1. A block selection signal /BS inverted by an inverter IN4 is input to the other input terminal of the NOR gate NR1. A block selection signal BS changes to high level when a corresponding block is selected. An output from the NOR gate NR1 is output from an output terminal SN1 of the latch circuit L3.

The output from the output node SN1 of the latch circuit L3 is input to the latch circuit L4. The latch circuit L4 has a clocked gate G6 which is ON while the clock ck is "high", and a clocked inverter CG5 and an inverter IN5 which are ON while the clock ck is "low".

The potential of the node NN1 which receives the operation results of the row main decoder while the clock ck of clock cycle 1 is "low" simultaneously passes through other circuit elements to be transferred to the output terminal SN1 of the latch circuit L3 through the nodes NN2 and ND1.

When a normal row free from any defect is selected, the node NN1 of this row is driven to "low" level, as described above. While the clock ck is "low" in the second half of clock cycle 1, the transistor P2 is turned on, and the node ND1 is charged to "high" level. Accordingly, the voltage of the node SN1 changes to "low" level. The "low" voltage level of the node SN1 is latched by the clocked inverter CG4 and the NOR gate NR1 which are turned on when the clock ck rises at the start of the next clock cycle 2. After passing through the clocked gate G6 which is simultaneously turned on, this voltage level is inverted by the inverter IN5 to drive the spare row selection line SWL to "high" level (non-selected state). Therefore, only one normal row selection line NWL is selected when a normal row free from any defect is selected.

Even if the clock ck changes to "low" in the second half of clock cycle 2, the potential of the normal row selection line NWL is maintained because the potential is latched by the clocked inverter CG3 and the inverter IN3.

When a defective row within the block is selected, the nodes NN1 of all the normal rows within the block are set in a non-selected state because the fuse F1 of this row is disconnected, and the node NN1 remains unchanged at "high" level. As a result, all the normal row selection lines NWL1 to NWL128 are set in a non-selected state. At the same time, the node ND1 within the block maintains "low" level obtained upon discharge by the transistor N1 while the clock ck of clock cycle 1 is "high" because all the transistors P2 within the block are kept off while the clock ck of clock cycle 1 is "low". The "low" level of the node ND1 is transferred to the input of the NOR gate NR1 through the clocked gate G5. If this block is selected, since the signal BS is "high", and the output from the inverter IN4 is "low", the two inputs of the NOR gate NR1 are driven to "low" to change the voltage of the node SN1 to "high" level. The "high" level of the node SN1 is latched by the clocked inverter CG4 and the NOR gate NR1 when the clock ck rises at the start of the next clock cycle 2. At the same time, this level passes through the clocked gate G6 and the inverter IN5 to drive the spare row selection line SWL to "low" level (selected state). Even if the clock ck changes to "low" in the second half of clock cycle 2, the potential of the spare row selection line SWL is maintained because the potential is latched by the clocked inverter CG5 and the inverter IN5.

The NOR gate is used in the latch circuit L3 of the spare row, its one input receives an output from the clocked gate G5, and the other input receives an output obtained by inverting the block selection signal (BS) by the inverter IN4 in order to reliably set the spare row selection line SWL within a corresponding block in a non-selected state when this block is not selected. More specifically, if the block is not selected, and the signal BS is at "low" level, the node SN1 is "low" regardless of the voltage level of the node ND1, and the spare row selection line SWL is driven to "high" (non-selected state). With this operation, only a spare row in a block having a defect can be selected.

The p-channel transistor P3 and the n-channel transistor N1 are arranged to reliably charge and discharge the node NN2 and the node ND1 to "high" and "low" while the clock ck is "high" in each clock cycle, and the clock gates G4 and G5 are closed, and to prevent static operation in which the transistors P2 and N1 are simultaneously turned on in the "low" clock ck duration in which a next decoding operation and a spare row selection control operation should be performed. More specifically, while the clock ck is "high" in each clock cycle, the transistor P3 is turned on, and the node NN2 becomes "high". At the same time, the transistor N1 is turned on to discharge the node ND1 to "low". For this reason, the node ND1 is dynamically, reliably discharged to "low" level by the transistor N1 without simultaneously turning on the transistors P2 and N1.

Figure 11:
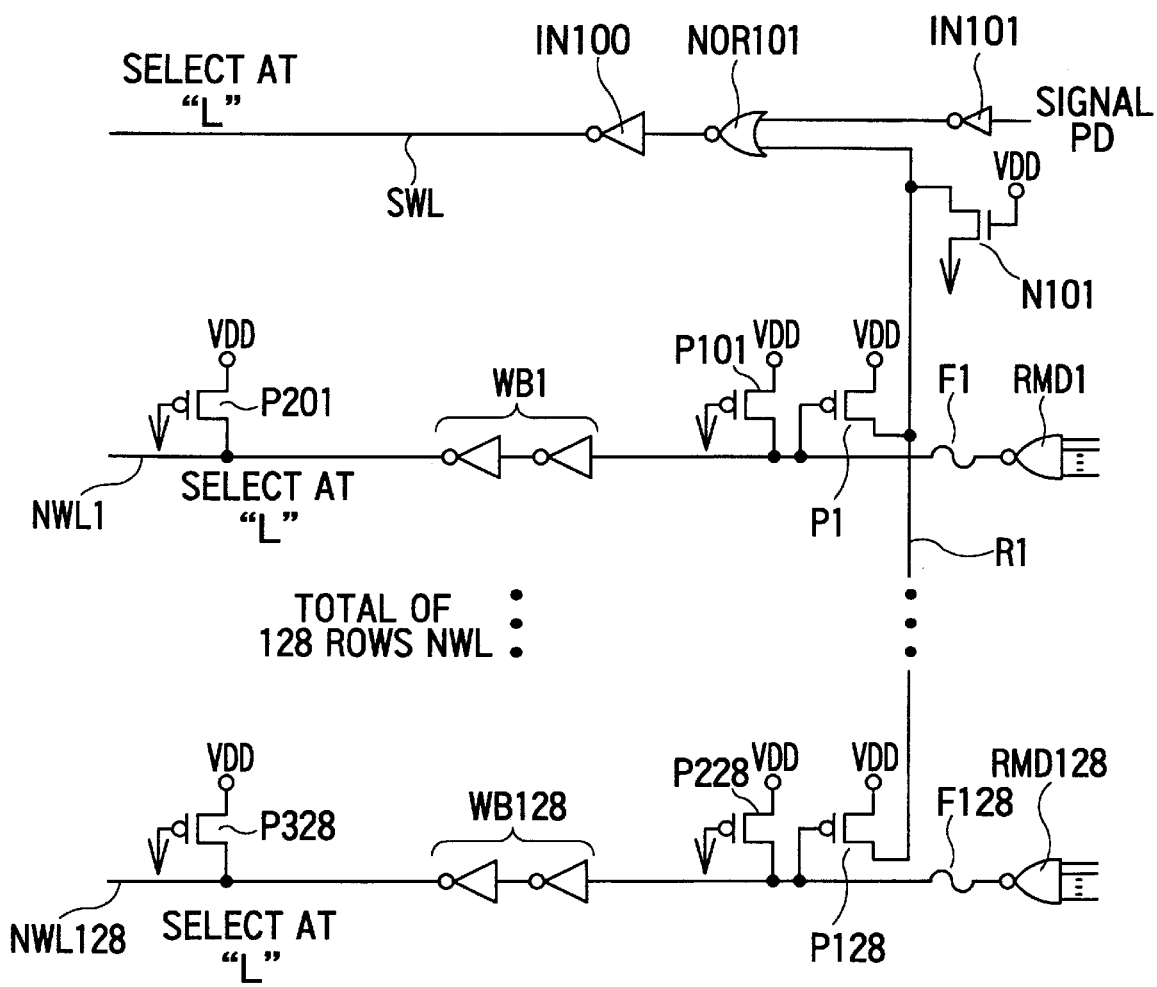
FIG. 11 is a circuit diagram showing the arrangement of a conventional semiconductor memory device.
Figure 12:
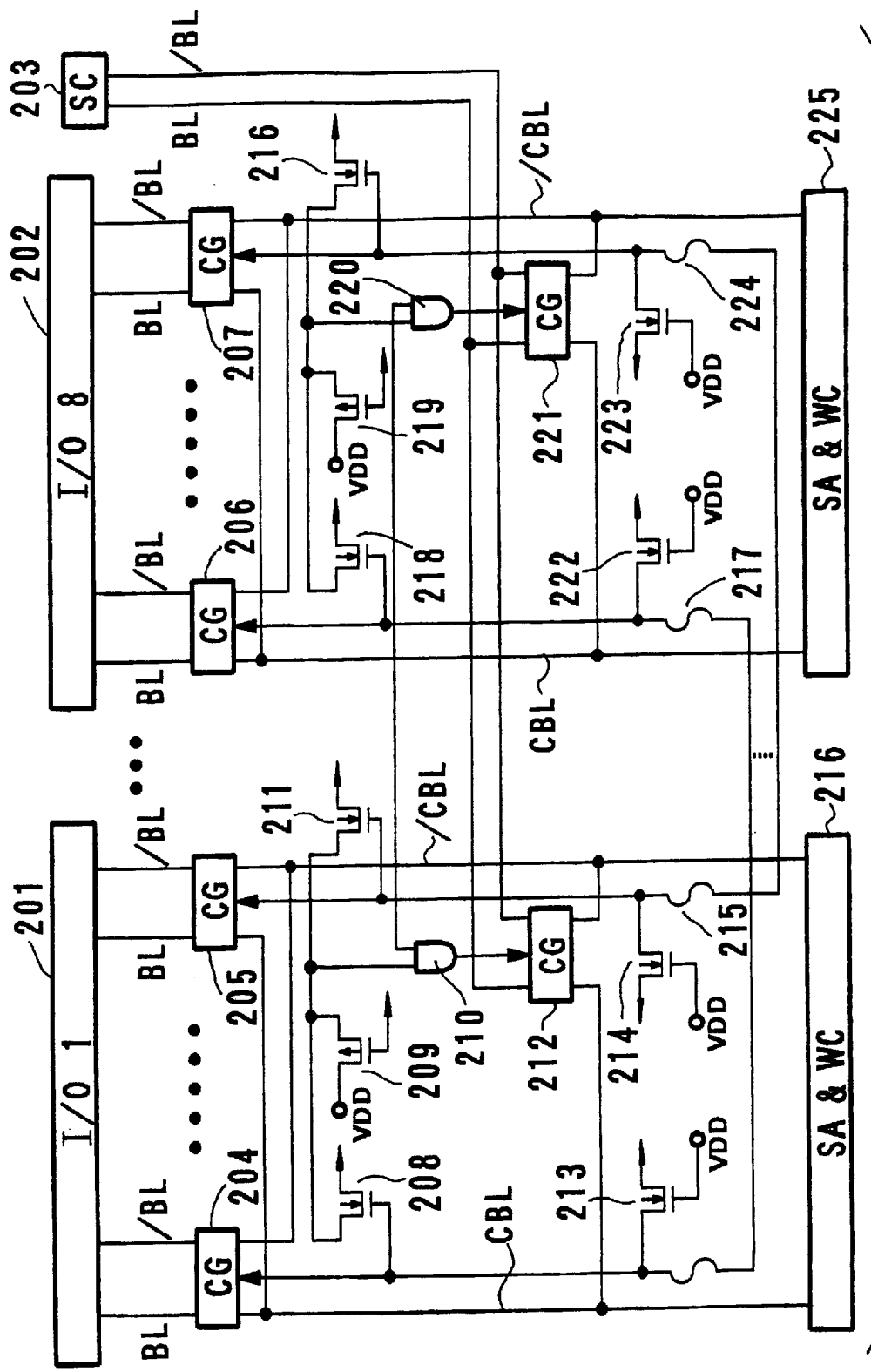
FIG. 12 is a circuit diagram showing the arrangement of another conventional semiconductor memory device.

As described above, the gate of the p-channel MOS transistor P2 connected to the node ND1 used to control selection/non-selection of the spare row is driven while the clock ck is "low", and the gate terminal of the n-channel MOS transistor N1 is ON-controlled only when the clock ck is "high". In other words, the node ND1 is only charged or discharged by either the transistor P2 or N1 without any static operation of simultaneously turning on the transistors P2 and N1, and therefore the operation is completely dynamic. For this reason, the control operation is not delayed by static operation as shown in the prior art of FIG. 11, and the operation is completely dynamic. Since discharging the node ND1 while the clock ck is "high", or charging it while the clock ck is "low" suffices to be completed within each period, substantially no delay is generated in word line control of control operation.

More specifically, the p-channel MOS transistor P2 need only have current driving force enough to charge the node ND1 from "low" level to "high" level while the clock ck is "low", i.e., the clocked gates G4 and G5 are ON. The n-channel MOS transistor N1 need only have current driving force enough to discharge the node ND1 charged at "high" level to a "low" potential while the clock ck is "high", i.e., the gate of the transistor N1 is ON.

Figure 3:
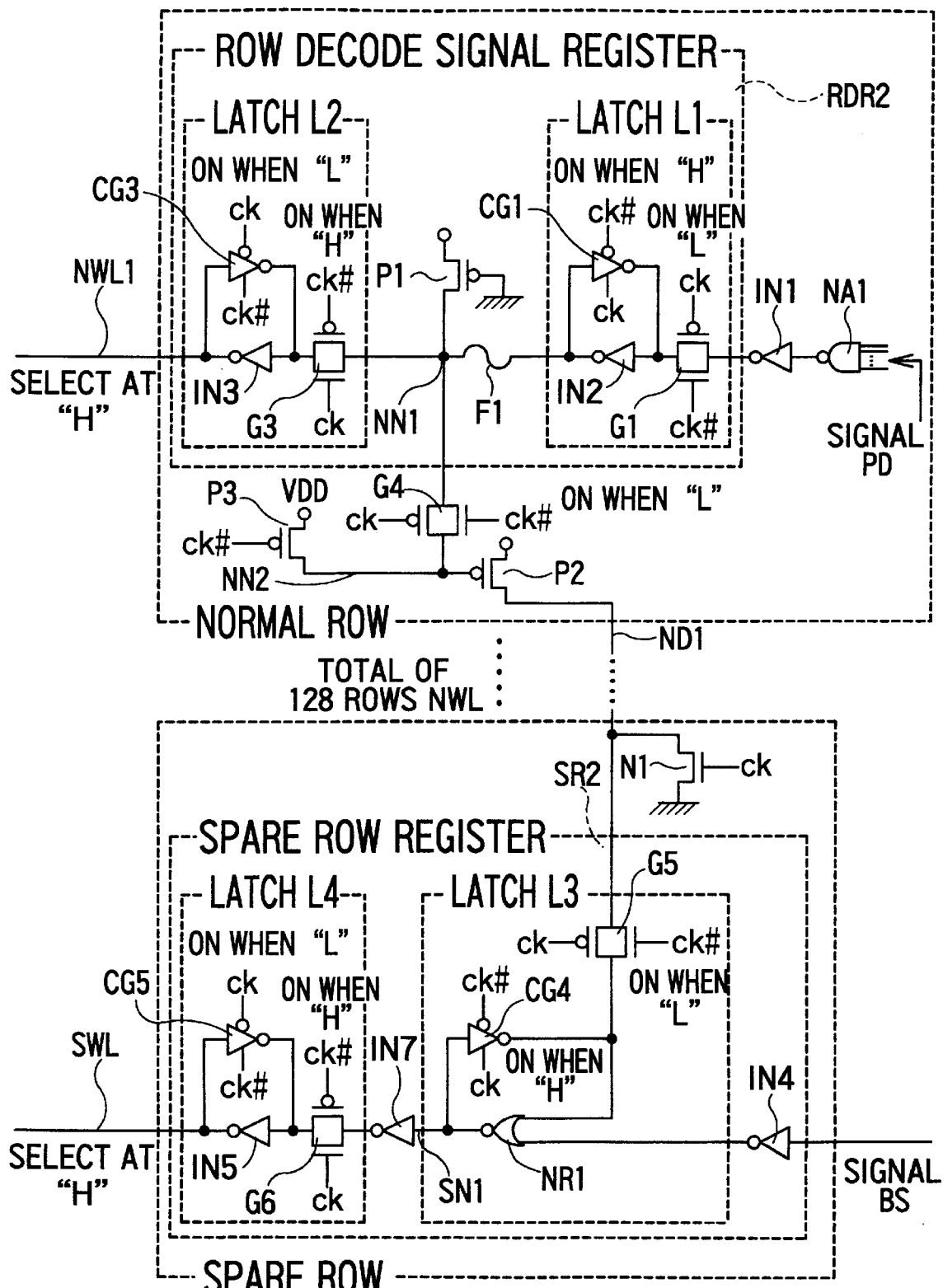
FIG. 3 is a circuit diagram showing the arrangement of a semiconductor memory device according to the second embodiment of the present invention.
Figure 15:
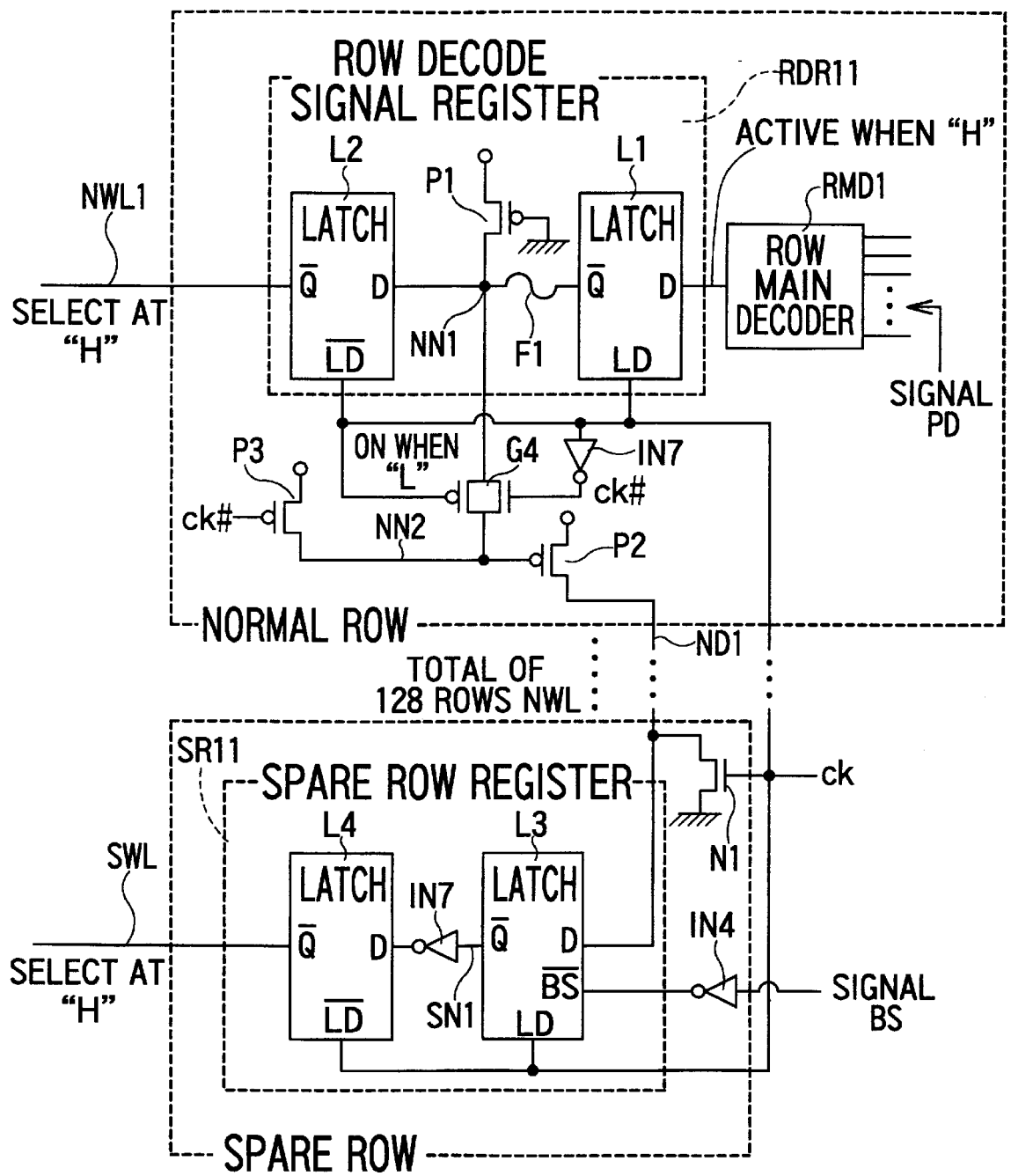
FIG. 15 is a circuit diagram showing a circuit arrangement when the circuit arrangement shown in FIG. 3 is expressed using a latch block.

FIG. 3 shows the arrangement of a semiconductor memory device according to the second embodiment of the present invention. In the first embodiment, the normal row selection line NWL and the spare row selection line SWL are in a selected state when they are at low level. In the second embodiment, the normal row selection line NWL and the spare row selection line SWL are in a selected state when they are at high level. As for the circuit arrangement, on the normal row, the inverter IN6 is series-connected between one terminal of the fuse F1 and the input terminal of the gate G3 in the first embodiment, whereas one terminal of a fuse F1 is directly connected to the input terminal of a gate G3 in the second embodiment. On the spare row, the output terminal of the NOR gate NR1 is directly connected to the input terminal of the gate G6 in the first embodiment, whereas an inverter IN7 is series-connected between the output terminal of a NOR gate NR1 and the input terminal of a gate G6. The remaining arrangement of the second embodiment is the same as that of the first embodiment, and the circuit operation is also the same except for the presence/absence of inversion by an inverter. FIG. 15 shows the arrangement of the second embodiment in which latch circuits L1, L2, L3, and L4 are expressed as latch blocks.

Figure 4:
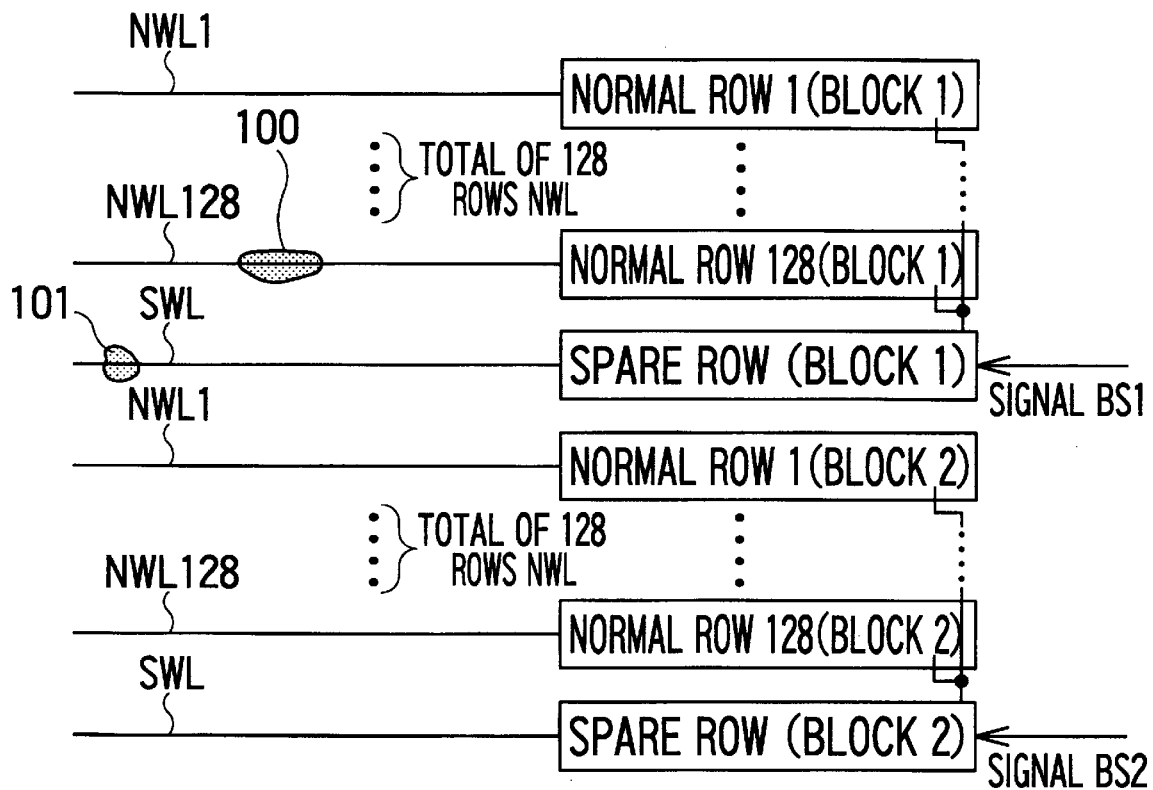
FIG. 4 is a block diagram showing an arrangement example when the arrangement shown in FIG. 1 or 3 is applied to a device having two blocks.

FIG. 4 shows an arrangement when the arrangement of a semiconductor memory device according to the first or second embodiment is applied to a device having two or more blocks. Each of blocks 1 and 2 has 128 normal rows and one spare row, and the respective blocks are separately formed in element formation regions in units of blocks.

Blocks 1 and 2 are selected by inputting block selection signals BS1 and BS2 to the spare rows, as described above. When a defective portion 100 such as a crystal defect exists in a normal selection line within block 1, and a defective portion 101 exists in a normal selection line within block 2, i.e., one defective portion exists in each block, the normal selection line in each block can be switched to one spare row to remedy the block. However, when a defective portion exists across two or more normal row selection lines within one block, the block cannot be remedied by the arrangement in FIG. 4. In some cases, a crystal defect may be generated over an area corresponding to one row, and may cause an error.

Figure 5:
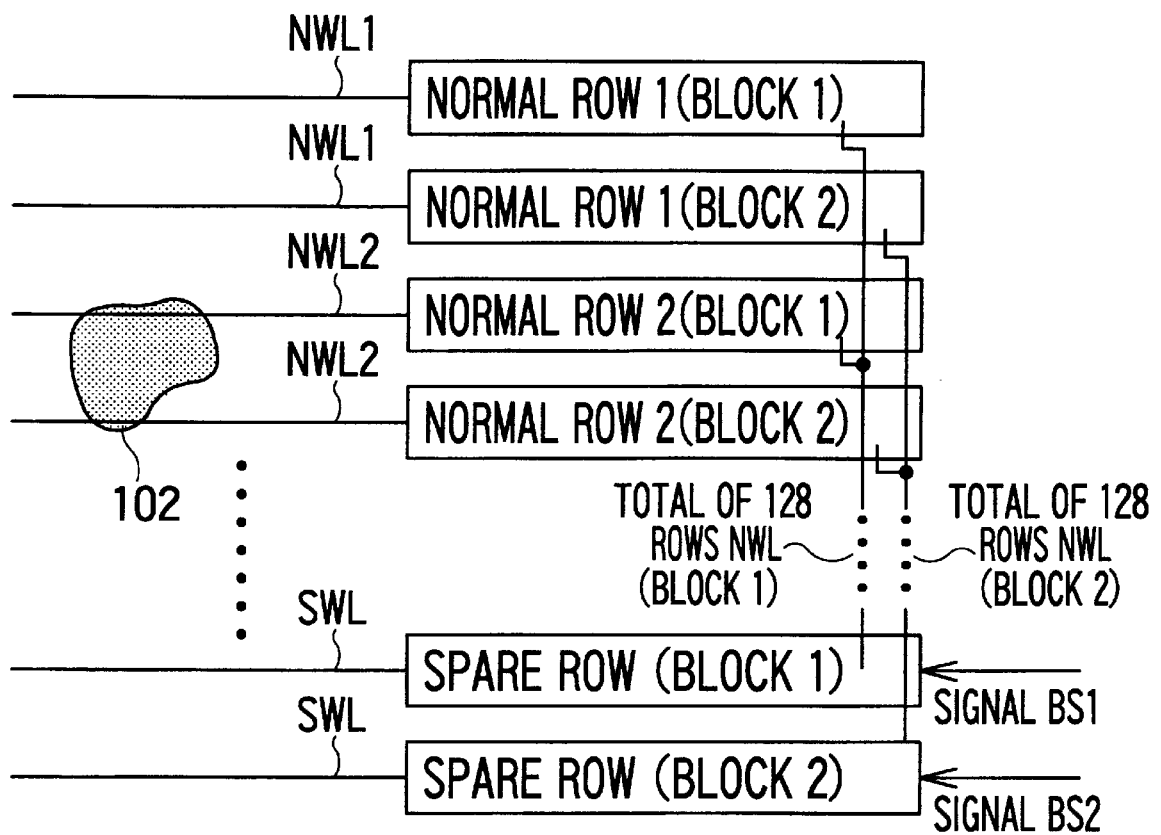
FIG. 5 is a block diagram showing another arrangement example when the arrangement shown in FIG. 1 or 3 is applied to a device having two blocks.

In an arrangement shown in FIG. 5, normal rows in blocks 1 and 2 are laid out such that they are mutually interleaved one by one. Similarly, the spare rows of blocks 1 and 2 are laid out adjacent to each other, and respectively receive the block selection signals BS1 and BS2.

With this arrangement, the blocks can be remedied even when a defective portion 102 such as a large crystal defect exists across normal row 2 of block 1 and normal row 2 of block 2 adjacent to each other. That is, defective normal row 2 of block 1 is switched to the spare row of block 1, and normal row 2 of block 2 is switched to the spare row of block 2.

Figure 6:
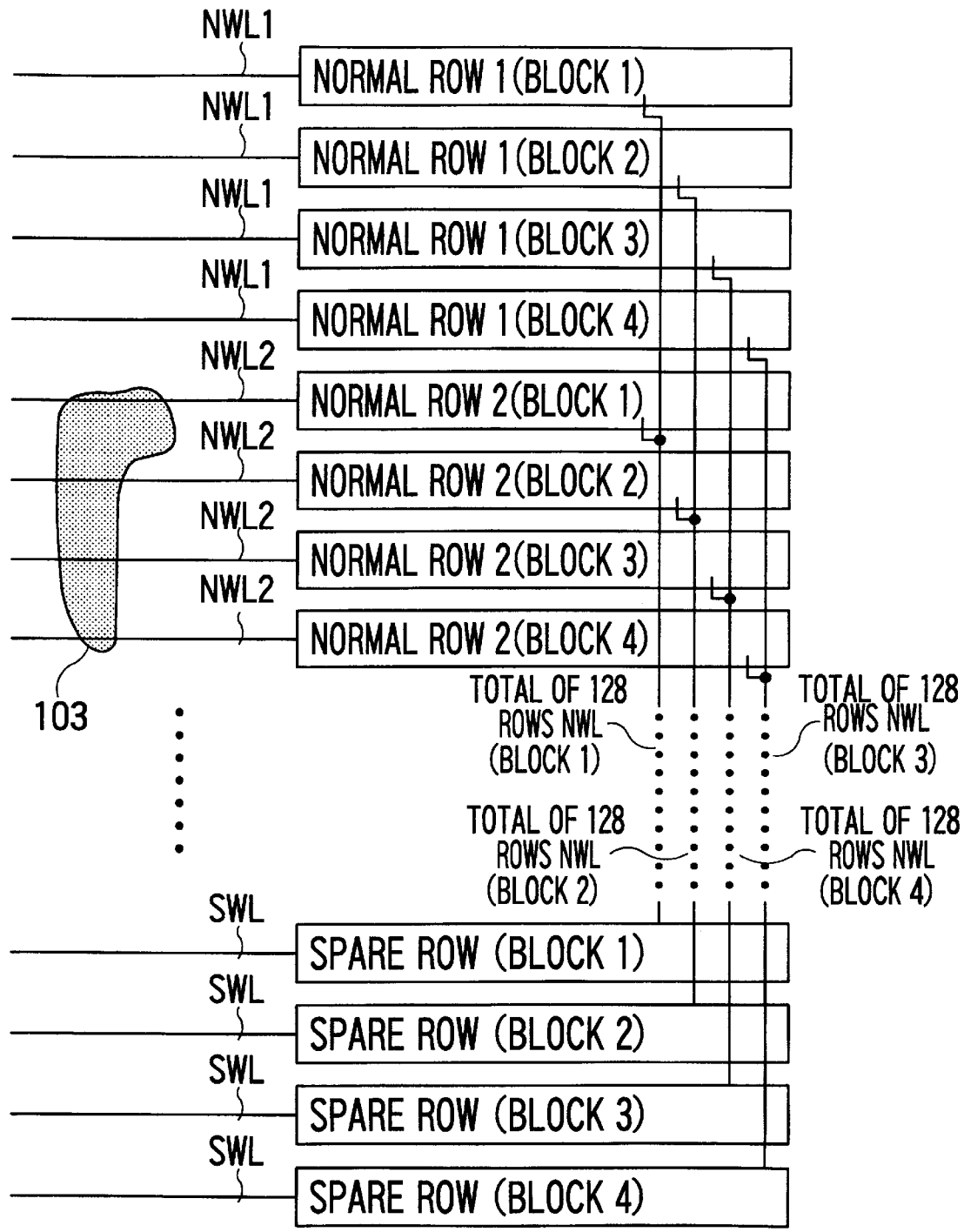
FIG. 6 is a block diagram showing still another arrangement example when the arrangement shown in FIG. 1 or 3 is applied to a device having four blocks.

With an arrangement shown in FIG. 6, blocks can be remedied even when a defective portion 103 across four rows is generated. In this arrangement, each of four blocks 1 to 4 has 128 normal rows and one spare row. The normal rows of blocks 1 to 4 are sequentially laid out one by one, and the spare rows of blocks 1 to 4 are sequentially laid out adjacent to each other. When the defective portion 103 exists across four rows from normal row 2 of block 1 to normal row 2 of block 4, normal row 2 of block 1 is switched to the spare row of block 1; normal row 2 of block 2, to the spare row of block 2; normal row 2 of block 3, to the spare row of block 3; and normal row 2 of block 4, to the spare row of block 4.

Figure 7:
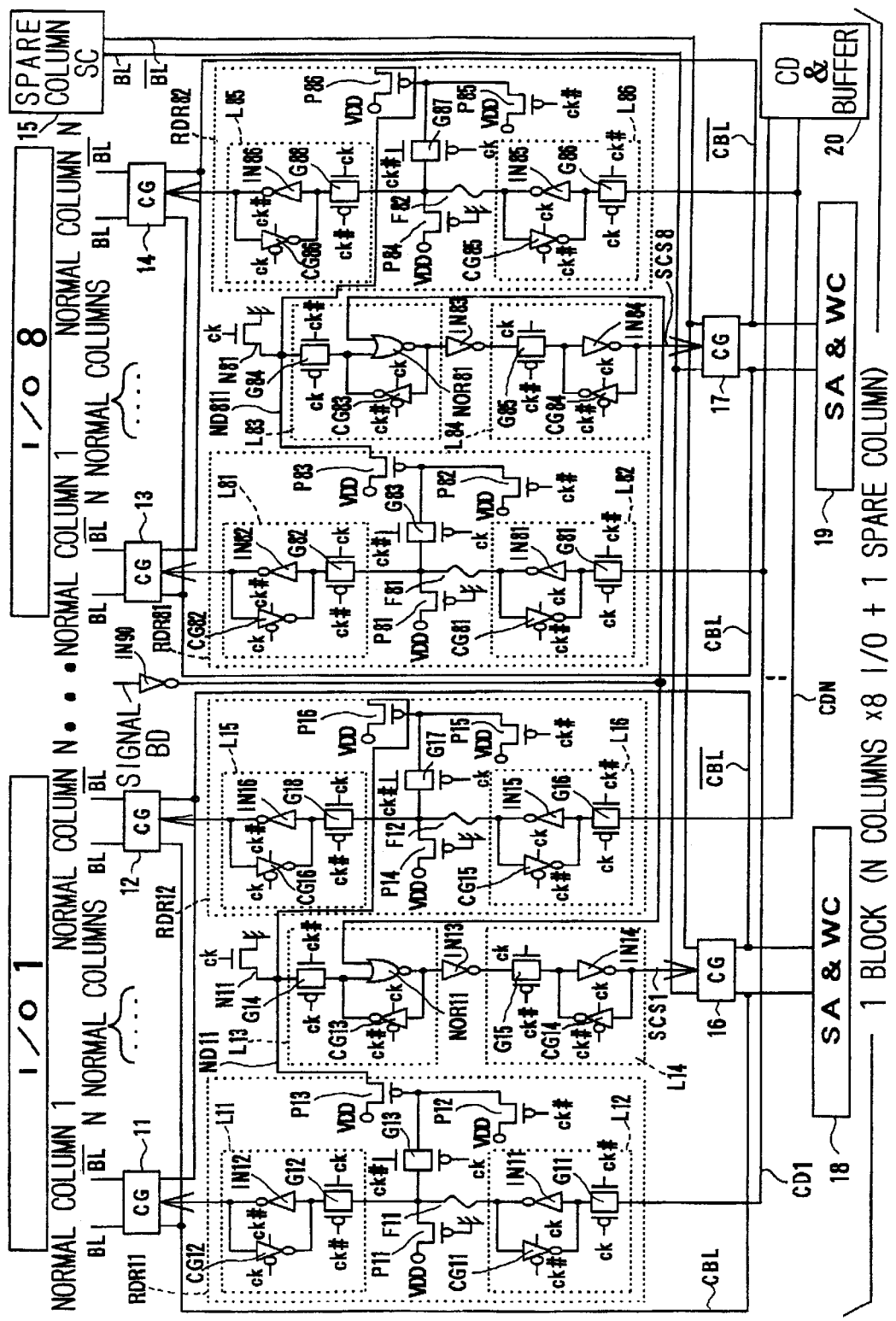
FIG. 7 is a circuit diagram showing the arrangement of a semiconductor memory device according to the third embodiment of the present invention.

FIG. 7 shows the arrangement of a semiconductor device according to the third embodiment of the present invention. In this embodiment, the control mechanism of switching a normal row to a spare row in the first and second embodiments is applied to columns. Eight input/output interfaces I/O are arranged, each input/output interface I/O has N normal columns, and one spare column 15 is arranged as a whole. With this arrangement, when a defect exists in one normal column in one of the input/output interfaces I/O, the defective column can be switched to the spare column 15.

The arrangement and operation of switching a normal column to the spare column 15 will be described in detail. Exemplifying an input/output interface I/O1, N column gates CG11, ..., CG12 are arranged, and a pair of bit lines BL and /BL are connected to each column gate. The column gates CG11 to CG12 are selected as follows. As in the first and second embodiments, switching control is performed in synchronism with a clock ck and an inverted clock ck#, and an address signal, a main clock, the clock ck, and the inverted clock ck# have the waveforms shown in FIG. 2.

A column decoder & buffer circuit 20 outputs a column decode signal, that selects one of columns, to column decode lines CD1 to CDN to change the selected column changes to high level. Assume that normal column 1 is selected, no defect exists in normal column 1, and a fuse F11 is not blown. Column decoding is performed in clock cycle 1 of the main clock, and the column decode line CD1 is driven to high level while the clock ck is at "high" level. When the clock ck goes "low", a gate G11 opens, the column decode line CD1 is inverted by an inverter IN11, and a "low"-level signal is supplied to the input of a gate G12 through the fuse F11. When the clock ck is at "high" level, the clocked gate CG11 operates to maintain the input/output level of the inverter IN11.

A p-channel MOS transistor P11 is connected between one terminal of the fuse F11 and a power supply VDD, and its gate receives a ground voltage GND to turn on the transistor P11. However, since the transistor P11 is small, one terminal of the fuse F11 maintains "low" level when a corresponding column is selected.

When the main clock enters clock cycle 2, and the clock ck changes to "high" level, the gate G12 opens to pass a "low"-level signal supplied to the input terminal of the gate G12. This signal is inverted to "high" level by an inverter IN12, and input to the column gate CG11 to select normal column 1. When the clock ck is at "low" level, the clocked gate CG12 operates to maintain the input/output level of the inverter IN12.

The input potential ("low" level) of the gate G12 passes through a gate G13 which opens when the clock ck is at "low" level, and is input to the gate of a p-channel MOS transistor P13 to turn on the transistor P13. The gate node of the transistor P13 is also connected to the drain of a p-channel MOS transistor P12 having a source connected to the power supply VDD and a gate connected to the clock ck#. While the clock ck is at "low" level, the transistor P12 is OFF, and the gate of the transistor P13 is driven to "low" level. As a result, a node ND11 connected to the drain of the transistor P13 is charged to "high" level. The node ND11 is also connected to the drain of an n-channel MOS transistor N11. The gate of the transistor N11 receives the clock ck. When the clock ck is at "low" level, the transistor N11 is OFF, and the node ND11 maintains "high" level. The "high"-level signal of the node ND11 passes through a gate G14 which opens when the clock ck is at "low" level, and is input to one input terminal of a NOR gate NOR11. Regardless of the level of the other input terminal, the NOR gate NOR11 outputs a "low"-level signal. The output from the NOR gate NOR11 is inverted by an inverter IN13, and the output from the inverter IN13 changes to "high" level. The "high"-level output from the inverter IN13 passes through a gate G15 which opens when the main clock enters clock cycle 2 and the clock ck is at "high" level, is inverted to "low" by an inverter IN14, and input to a column gate CG16 to set a corresponding column in a non-selected state.

When column gates CG16 and CG17 of all the input/output interfaces I/O are in a non-selected state, no spare column 15 is selected. When no defective column exists, the interfaces I/O1 to I/O8 for normal columns are in operation, and data is to be written, data output from a sense amplifier & write circuit 18 and a sense amplifier & write circuit 19 pass through pairs of common bit lines CBL and /CBL and column gates 11 through 14 of the respective interfaces I/O. The data are supplied to the pair of bit lines BL and /BL of a selected column, and written in the memory cell of the selected column in a memory cell array (not shown). In reading data, data output from the memory cell of a selected normal column passes through the pair of bit lines BL and /BL, the column gate CG, and the pair of common bit lines CBL and /CBL. The data is supplied to the sense amplifier & write circuit 18 to be externally read.

A case wherein a defect exists in the first normal column of the interface I/O1, and the fuse F11 is blown will be explained. The input terminal of the gate G12 is charged by the transistor P11 to be always at "high" level. While the clock ck is at "high" level, the "high"-level potential is transferred to the input of the inverter IN12 through the gate G12. The "low"-level potential inverted by the inverter IN12 is always input to the column gate 11. With this operation, the column gate CG11 of the normal column is always in a non-selected state.

While the clock ck of clock cycle 1 is at "low" level, the gate G13 opens to pass the potential ("high" level) of the input terminal of the gate G12. The potential is input to the gate of the p-channel MOS transistor P13 to turn off the transistor P13. As described above, the node ND11 is discharged to "low" level by the n-channel MOS transistor N11 which is ON while the clock ck is at "high" level. While the clock ck of clock cycle 1 is at "low" level, the gate G14 opens to pass this potential and input it to one input terminal of the NOR gate NOR11.

A signal obtained by inverting the block decode signal BD by the inverter IN90 is input to the other input terminal of the NOR gate NOR11. Since the "high"-level signal BD is input when a corresponding block is selected, a "low"-level signal is supplied to the input terminal of the NOR gate NOR11. Therefore, a "high"-level signal is output from the NOR gate NOR1, and inverted by the inverter IN13 to supply a "low"-level potential to the input node of the gate G15. While the clock ck of clock cycle 2 is at "high" level, the gate G15 opens to pass the "low"-level signal and input it to the inverter IN14. The "high"-level signal inverted by the inverter IN14 is input to a column gate 16 to set it in a selected state. Consequently, the sense amplifier & write circuit 18 and the spare column 15 are connected via the pair of common bit lines CBL and /CBL, the column gate CG16, and the pair of bit lines BL and /BL. In this manner, the defective normal column is switched to the spare column 15.

The case wherein a defect exists in the first column of the interface I/O1 has been exemplified. Also when a defect exists in one of normal columns 1 to N of the remaining interfaces I/O2 to I/O8, the defective column is similarly replaced by the spare column 15. For example, when a defect exists in the first column of the interface I/O8, a high-level signal is input to a column gate 17 to set it in a selected state. The sense amplifier & write circuit 19 and the spare column 15 are connected via the pair of common bit lines CBL and /CBL, the column gate 17, and the pair of bit lines BL and /BL.

Also in the third embodiment, similar to the first and second embodiments, switching control can be performed by dynamic operation in synchronism with the clock ck to realize high-speed operation.

As described above with reference to FIGS. 5 and 6, if normal and spare columns are sequentially interleaved and laid out between a plurality of blocks, even when a defective portion exists across two or more columns, the defective columns are switched to the spare columns to remedy the blocks.

Figure 8:
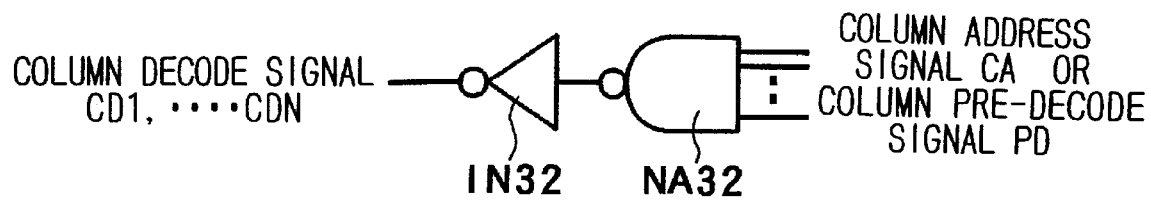
FIG. 8 is a circuit diagram showing a column decoder & buffer circuit in the semiconductor memory device.

The column decoder & buffer circuit in FIG. 7 has, e.g., an arrangement shown in FIG. 8. A column address signal CA or a pre-decode signal PD is input to a NAND gate NA32 as a signal for selecting one of normal columns. In selecting a corresponding normal column, all the high-level signals CA or PD are input to the NAND gate NA32 to output a low-level signal. The low-level signal is inverted by an inverter IN32 to a high-level signal, which is transferred to the column decode line CD.

Figure 9:
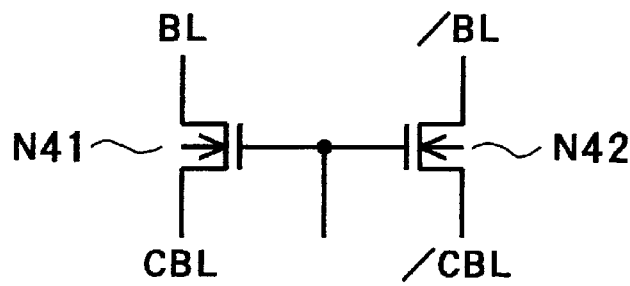
FIG. 9 is a circuit diagram showing a circuit arrangement when a column gate in the semiconductor memory device is an n-channel MOS transistor.
Figure 10:
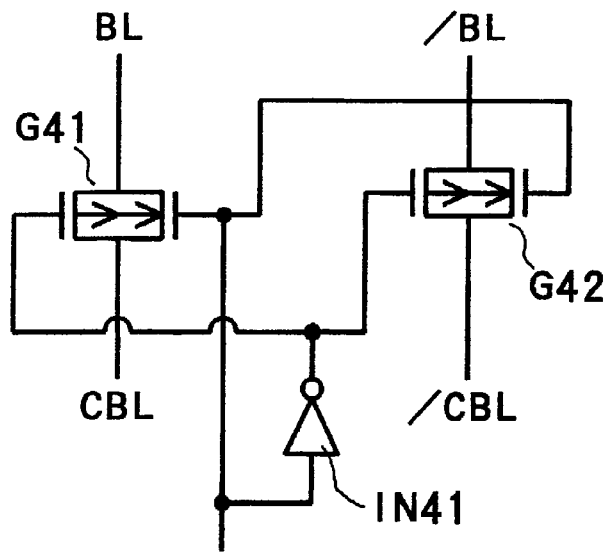
FIG. 10 is a circuit diagram showing a circuit arrangement when the column gate in the semiconductor memory device is a CMOS circuit.

FIG. 9 or 10 shows a detailed arrangement of the column gate CG in FIG. 7. When the column gate CG is constituted by n-channel MOS transistors N41 and N42, it has, e.g., the arrangement shown in FIG. 9. The two terminals of each of the transistors N41 and N42 are series-connected between the column bit line CBL or /CBL and the bit line BL or /BL. When a corresponding column is selected, a high-level signal is input to the gates of the transistors N41 and N42 to turn them on. Accordingly, the pair of column lines CBL and /CBL and the pair of bit lines BL and /BL are rendered conductive.

When the column gate CG is constituted by a CMOS circuit, it has, e.g., an arrangement shown in FIG. 10. Gates G41 and G42 each constituted by p- and n-channel MOS transistors are series-connected between the column bit lines CBL and /CBL and the bit lines BL and /BL. When a corresponding column is selected, a high-level signal is input to the gates of the n-channel MOS transistors of the gates G41 and G42, and a low-level signal inverted by an inverter IN41 is input to the gates of the p-channel MOS transistors to turn on the gates G41 and G42 and render the pair of column bit lines CBL and /CBL and the pair of bit lines BL and /BL conductive.

Figure 18:
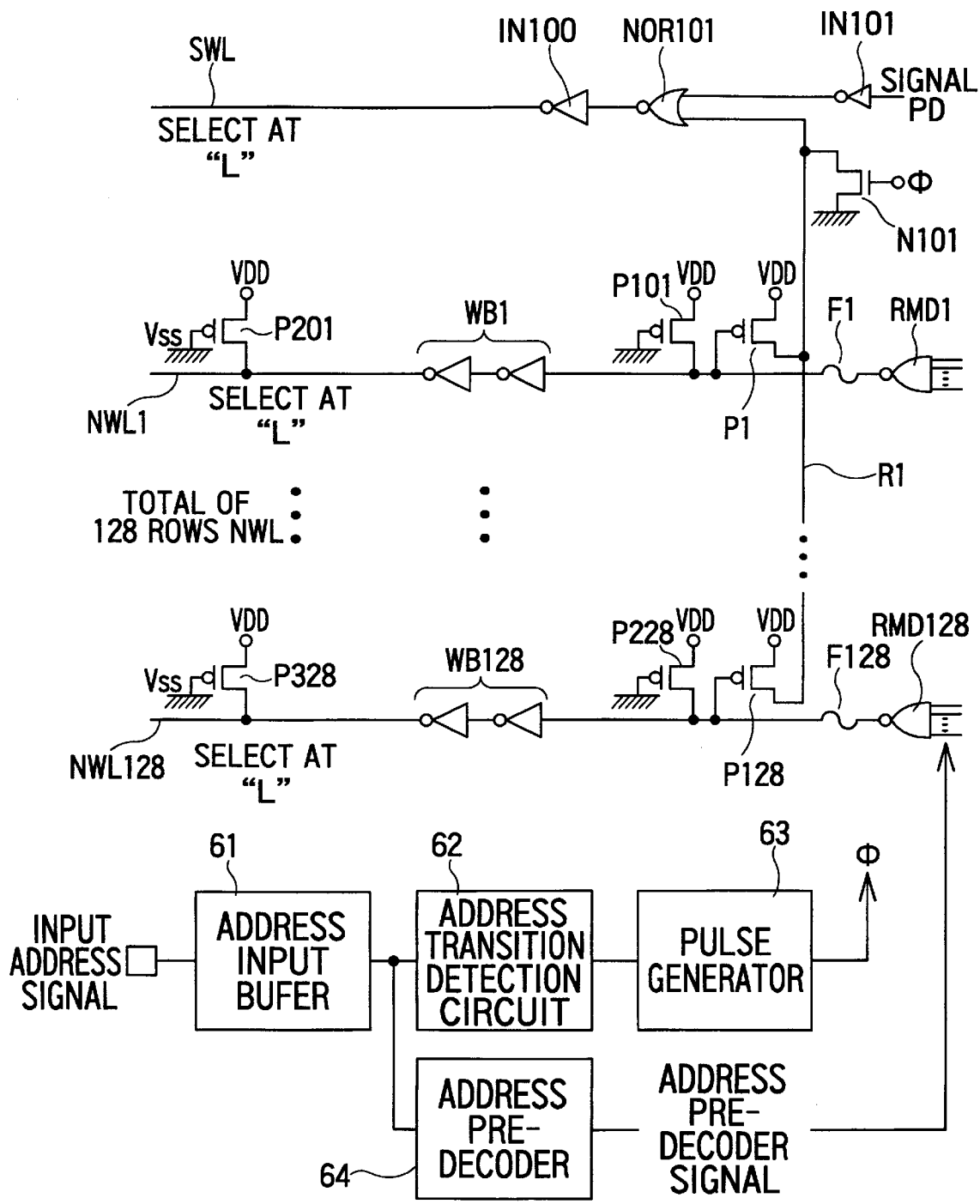
FIG. 18 is a circuit diagram showing the arrangement of a semiconductor memory device according to the fourth embodiment of the present invention.
Figure 20:
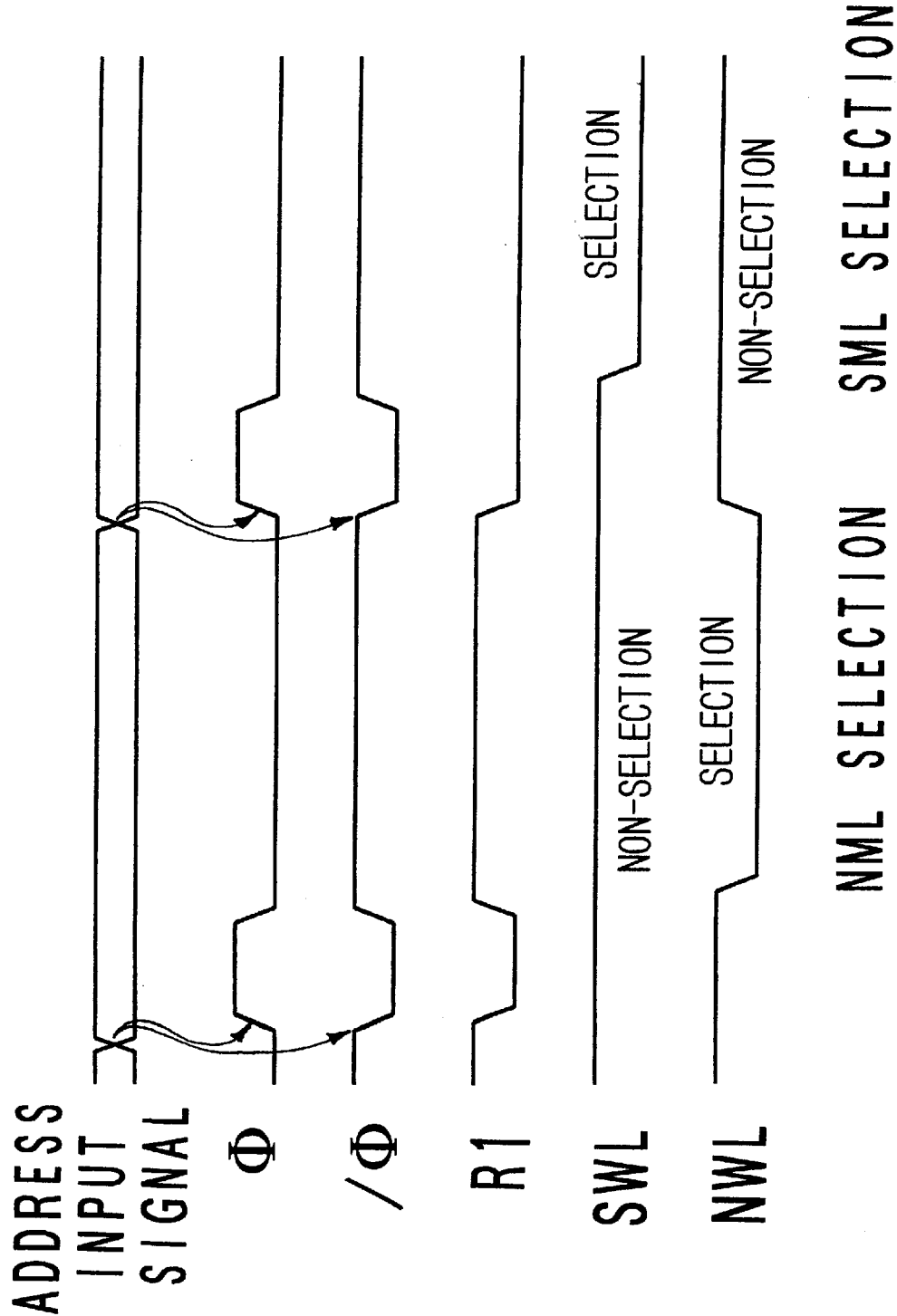
FIG. 20 is a timing chart showing the waveforms of signals in the fourth and fifth embodiments.

The application of the present invention to a memory in which control is performed in synchronism with a clock has been explained. Further, as shown in FIG. 18, a scheme of controlling the gate input signal of a transistor N101 which discharges a control node R1 in a conventional asynchronous memory, by a pulse Φ generated using an address transition detector upon a change in address input signal can also be realized as the fourth embodiment. FIG. 20 shows the operation waveforms of the respective signals in the embodiment of FIG. 18. The pulse Φ generated upon detecting a change in address input signal is input to the gate of the transistor N101 to turn on the transistor N101. In this period, the control node R1 is discharged to "low" level. In synchronism with the end point of the pulse Φ, decoding of row main decoders RMD1 to RMD128 ends. If a normal row free from any defect is selected as a result of decoding, transistors P1 to P128 on this row are turned on to charge the node R1 to "high" level. If the selected row is a defective row, a fuse F1 is blown. Consequently, all the transistors P1 to P128 in the block are turned off, the node R1 is kept at "low" level, and the spare row is selected. The fourth embodiment is different from the conventional circuit in FIG. 11 in that, since the pulse Φ has already expired in controlling the gates of the transistors P1 to P128 on each row after decoding, the transistors P1 to P128 and the transistor N101 are not simultaneously turned on, realizing dynamic operation. That is, the transistor N101 is OFF when the node R1 is charged by the transistors P1 to P128 on a selected row after being discharged by the transistor N101 while the pulse Φ is "high". For this reason, the node R1 is changed from "low" to "high" by dynamic operation at a high speed.

Figure 19:
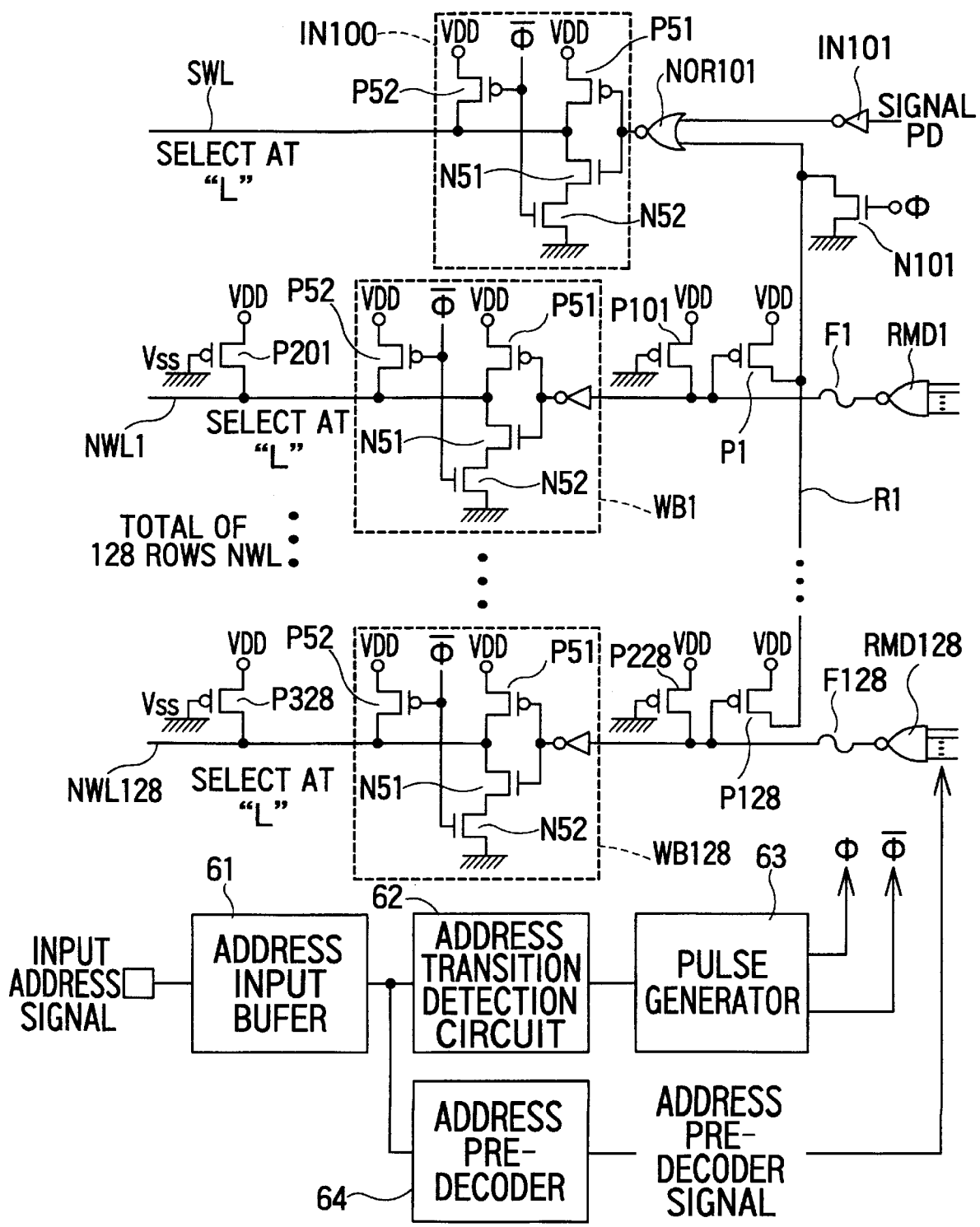
FIG. 19 is a circuit diagram showing the arrangement of a semiconductor memory device according to the fifth embodiment of the present invention.

FIG. 19 shows the fifth embodiment. In a circuit of FIG. 19, buffers WB1 to WB128 using 2-input NAND circuits are used as buffer circuits for respectively driving the word lines of normal and spare rows. They receive signals from decoders RMD1 to RMD128 through the first inputs, and at the same time an inverted signal Φ# of a pulse Φ through the other inputs. With this arrangement, the potentials of the word lines of the normal and spare rows can be reliably set in a non-selected state while the signal Φ is "high", and a transistor N101 discharges a node R1. More specifically, when the word line driving buffers of the normal and spare lines are not controlled by the pulse Φ, unlike the fourth embodiment in FIG. 18, if the decode operation, delay, and "high" pulse Φ duration shift from each other, the word lines of the normal and spare rows may be temporarily driven to an incorrect potential due to the shift. In this case, if the 2-input word line buffers WB1 to WB128 are used as in the fifth embodiment, a malfunction can be prevented even when such an operation time shift takes place.

The above-described embodiments are only examples, and do not limit the present invention. For example, the arrangements shown in FIGS. 1, 3, and 7 are examples, and the present invention can be variously modified as far as control of switching a normal row or column to a spare row or column is performed by dynamic operation in synchronism with the clock ck that defines the timing of internal operation.

What is claimed is:

1. A semiconductor memory device which has at least one block in which memory cells are respectively arranged on a plurality of normal rows and one spare row, and selects a row using a clock signal, said each block comprising:

a plurality of normal row selection lines for selecting one of said normal rows;

a spare row selection line for selecting said spare row instead of one of said normal rows which is selected and has a defect;

normal row selection circuits arranged on each of said normal row selection lines respectively, each normal row selection circuit having fuses arranged in correspondence with said normal row selection lines, each of said fuses having ends connected between a first node and a second node receiving a decode signal, and is blown when a corresponding normal row has a defect, each normal row selection circuit having selection and non-selection means for selecting one of said normal rows and setting the first node at a first selected level in accordance with the decode signal when the clock signal has a first level, and for setting other normal row selection lines in a non-selected state in accordance with the decode signal and setting the first nodes at a first non-selected level when the clock signal has the first level, each normal row selection circuit having a fixing means for fixing the first node connected to the blown fuse at the first non-selected level, and each normal row selection circuit having a first setting means for setting a common node connected to all of the first nodes at a second selected level by charging the common node in accordance with the level of the first node when a non-defective normal row selection line is selected and the clock signal has the first level, and not charging the common node so as to set the common node at a second non-selected level when all of said normal row selection lines are set in said non-selected state and the clock signal has the first level; and a spare row selection circuit arranged on said spare row selection line, said spare row selection circuit having a second setting means for setting the common node at the second non-selected level when the clock signal has a second level, said spare row selection circuit having a spare selection and non-selection means for selecting said spare row selection line when the clock signal becomes the second level if the common node has the second non-selected level and the clock signal has the first level, and for setting said spare row selection line in said non-selected state if the common node does not have the second non-selected level and the clock signal has the first level, wherein the spare row selection line is selected in synchronism with the clock signal and selected by dynamic operation performed by said first setting means and said second setting means.

2. A device according to claim 1, further comprising an address change detection circuit which externally receives an address signal, detects a change in the address signal, and outputs the clock signal.

3. A semiconductor memory device which has at least one block in which memory cells are respectively arranged on a plurality of normal rows and one spare row, and selects a row using a clock signal, said each block comprising:

a plurality of normal row selection lines for selecting one of said normal rows:

a spare row selection line for selecting said spare row instead of one of said normal rows which is selected and has a defect;

normal row selection circuits arranged on each of said normal row selection lines respectively, each normal row selection circuit having fuses arranged in correspondence with said normal row selection lines, each of said fuses having ends connected between a first node and a second node receiving a decode signal, and is blown when a corresponding normal row has a defect, each normal row selection circuit having selection and non-selection means for selecting one of said normal rows and setting the first node at a first selected level in accordance with the decode signal when the clock signal has a first level, and for setting other normal row selection lines in a non-selected state in accordances the decode signal and setting the first nodes at a first non-selected level when the clock signal has the first level, each normal row selection circuit having a fixing means for fixing the first node connected to the blown fuse at the first non-selected level, and each normal row selection circuit having a first setting means for setting a common node connected to all of the first nodes at a second selected level by charging the common node in accordance with the level of the first node when a non-defective normal row selection line is selected and the clock signal has the first level, and not charging the common node so as to set the common node at a second non-selected level when all of said normal row selection lines are set in said non-selected state and the clock signal has the first level; and a spare row selection circuit arranged on said spare row selection line, said spare row selection circuit having a second seating means for setting the common node at the second non-selected level when the clock signal has a second level, said spare row selection circuit having a spare selection and non-selection means for selecting said spare row selection line when the clock signal becomes the second level if the common node has the second non-selected level and the clock signal has the first level, and for setting said spare row selection line in said non-selected state if the common node does not have the second non-selected level and the clock signal has the first level, wherein the spare row selection line is selected in synchronism with the clock signal and selected by dynamic operation performed by said first setting means and said second setting means, and said normal row selection lines are laid out to be mutually interleaved between the respective blocks.

4. A device according to claim 3, further comprising an address change detection circuit which externally receives an address signal, detects a change in the address signal, and outputs the clock signal.

5. A semiconductor memory device which has at least one block in which memory cells are respectively arranged on a plurality of normal rows and one spare row, and selects a row using a clock signal, said each block comprising:

a plurality of normal row selection lines for selecting one of said normal rows;

a spare row selection line for selecting said spare row instead of one of said normal rows which is selected and has a defect;

normal row selection circuits arranged on each of said normal row selection lines respectively, each normal row selection circuit having fuses arranged in correspondence with said normal row selection lines, each of said fuses having ends connected between a first node and a second node receiving a decode signal, and is blown when a corresponding normal row has a defect, each normal row selection circuit having selection and non-selection means for selecting one of said normal rows and setting the first node at a first selected level in accordance with the decode signal when the clock signal has a first level, and for setting other normal row selection lines in a non-selected state in accordance with the decode signal and setting the first nodes at a first non-selected level when the clock signal has the first level, each normal row selection circuit having a fixing means for fixing the first node connected to the blown fuse at the first non-selected level, and each normal row selection circuit having a first setting means for setting a common node connected to all of the first nodes at a second selected level by charging the common node in accordance with the level of the first node when a non-defective normal row selection line is selected and the clock signal has the first level, and not charging the common node so as to set the common node at a second non-selected level when all of said normal row selection lines are set in said non-selected state and the clock signal has the first level; and a spare row selection circuit arranged on said spare row selection line, said spare row selection circuit having a second setting means for setting the common node at the second non-selected level when the clock signal has a second level, said spare row selection circuit having a block selection circuit for receiving a block selection signal and receiving a level of the common node, and said spare row selection circuit having a spare selection and non-selection means for selecting said spare row selection line when the clock signal becomes the second level if the common node has the second non-selected level at the time when the clock signal has the first level and a corresponding block is selected by the block selection signal and for setting said spare row selection line in said non-selected state if either the common node does not have the second non-selected level at the time when the clock signal has the first level or the corresponding block is not selected by the block selection signal, wherein the spare row selection line is selected in synchronism with the clock signal and selected by dynamic operation performed by said first setting means and said second setting means.

6. A device according to claim 5, further comprising an address change detection circuit which externally receives an address signal, detects a change in the address signal, and outputs the clock signal.

7. A semiconductor memory device which has at least one block in which memory cells are respectively arranged on a plurality of normal columns and one spare column, and selects a column using a clock signal, said each block comprising:

a plurality of normal column selection lines for selecting one of said normal columns;

a spare column selection line for selecting said spare column instead of one of said normal columns which is selected and has a defect;

normal column selection circuits arranged on each of said normal column selection lines respectively, each normal column selection circuit having fuses arranged in correspondence with said normal column selection lines, each of said fuses having ends connected between a first node and a second node receiving a decode signal, and is blown when a corresponding normal column has a defect, each normal column selection circuit having selection and non-selection means for selecting one of said normal columns and setting the first node at a first selected level in accordance with the decode signal when the clock signal has a first level, and for setting other normal column selection lines in a non-selected state in accordance with the decode signal and setting the first nodes at a first non-selected level when the clock signal has the first level, each normal column selection circuit having a fixing means for fixing the first node connected to the blown fuse at the first non-selected level, and each normal column selection circuit having a first setting means for setting a common node connected to all of the first nodes at a second selected level by charging the common node in accordance with the level of the first node when a non-defective normal column selection line is selected and the clock signal has the first level, and not charging the common node so as to set the common node at a second non-selected level when all of said normal column selection lines are set in said non-selected state and the clock signal has the first level; and a spare row selection circuit arranged on said spare column selection line, said spare column selection circuit having a second setting means for setting the common node at the second non-selected level when the clock signal has a second level, said spare column selection circuit having a spare selection and non-selection means for selecting said spare column selection line when the clock signal becomes the second level if the common node has the second non-selected level and the clock signal has the first level, and for setting said spare column selection line in said non-selected state if the common node does not have the second non-selected level and the clock signal has the first level, wherein the spare column selection line is selected in synchronism with the clock signal and selected by dynamic operation performed by said first setting means and said second setting means.

8. A device according to claim 7, further comprising an address change detection circuit which externally receives an address signal, detects a change in the address signal, and outputs the clock signal.

9. A semiconductor memory device which has at least one block in which memory cells are respectively arranged on a plurality of normal columns and one spare column, and selects a column using a clock signal, said each block comprising:

a plurality of normal column selection lines for selecting one of said normal columns;

a spare column selection line for selecting said spare column instead of one of said normal columns which is selected and has a defect;

normal column selection circuits arranged on each of said normal column selection lines respectively, each normal column selection circuit having fuses arranged in correspondence with said normal column selection lines, each of said fuses having ends connected between a first node and a second node receiving a decode signal, and is blown when a corresponding normal column has a defect, each normal column selection circuit having selection and non-selection means for selecting one or said normal columns and setting the first node at a first selected level in accordance with the decode signal when the clock signal has a first level, and for setting other normal column selection lines in a non-selected state in accordance with the decode signal and setting the first nodes at a first non-selected level when the clock signal has a first level, each normal column selection circuit having a fixing means for fixing the first node connected to the blown fuse at the first non-selected level, and each normal column selection circuit having a first setting means for setting a common node connected to all of the first nodes at a second selected level by charging the common node in accordance with the level of the first node when a non-defective normal column selection line is selected and the clock signal has the first level, and not charging the common node so as to set the common node at a second non-selected level when all of said normal columns selection lines are set in said non-selected state and the clock signal has the first level; and a spare column selection circuit arranged on said spare column selection line, said spare column selection circuit having a second setting means for setting the common node at the second non-selected level when the clock signal has a second level, said spare column selection circuit having a spare selection and non-selection means for selecting said spare column selection line when the clock signal becomes the second level if the common node has the second non-selected level and the clock signal has the first level, and for setting said spare column selection line in said non-selected state if the common node does not have the second non-selected level and the clock signal has the first level;

wherein the spare column selection line is selected in synchronism with the clock signal and selected by dynamic operation performed by said first setting means and said second setting means, and said normal column selection lines are laid out to be mutually interleaved between the respective blocks.

10. A device according to claim 9, further comprising an address change detection circuit which externally receives an address signal, detects a change in the address signal, and outputs the clock signal.

11. A semiconductor memory device which has at least one block in which memory cells are respectively arranged on a plurality of normal columns and one spare column, and selects a column using a clock signal, said each block comprising:

a plurality of normal column selection lines for selecting one of said normal columns;

a spare column selection line for selecting said spare column instead of one of said normal columns which is selected and has a defect;

normal column selection circuits arranged on each of said normal column selection lines respectively, each normal column selection circuit having fuses arranged in correspondence with said normal column selection lines, each of said fuses having ends connected between a first node and a second node receiving a decode signal, and is blown when a corresponding normal column has a defect, each normal column selection circuit having selection and non-selection means for selecting one of said normal columns and setting the first node at a first selected level in accordance with the decode signal when the clock signal has a first level, and for setting other normal column selection lines in a non-selected state in accordance with the decode signal and setting the first nodes at a first non-selected level when the clock signal has the first level, each normal column selection circuit having a fixing means for fixing the first node connected to the blown fuse at the first non-selected level, and each normal column selection circuit having a first setting means for setting a common node connected to all of the first nodes at a second selected level by charging the common node in accordance with the level of the first node when a non-defective normal column selection line is selected and the clock signal has the first level, and not charging the common node so as to set the common node at a second non-selected level when all of said normal column selection lines are set in said non-selected state and the clock signal has the first level; and a spare column selection circuit arranged on said spare column selection line, said spare column selection circuit having a second setting means for setting the common node at the second non-selected level when the clock signal has a second level, said spare column selection circuit having a block selection circuit for receiving a block selection signal and receiving a level of the common node, and said spare column selection circuit having a spare selection and non-selection means for selecting said spare column selection line when the clock signal becomes the second level if the common node has the second non-selected level at the time when the clock signal has the first level and a corresponding block is selected by the block selection signal, and for setting said spare column selection line in said non-selected state if either the common node does not have the second non-selected level at the time when the clock signal has the first level or the corresponding block is not selected by the block signal;

wherein the spare column selection line is selected in synchronism with the clock signal and selected by dynamic operation performed by said first setting means and said second setting means.

12. A device according to claim 11, further comprising an address change detection circuit which externally receives an address signal, detects a change in the address signal, and outputs the clock signal.

* * * * *